US006713235B1

(12) United States Patent
Ide et al.

(10) Patent No.: US 6,713,235 B1
(45) Date of Patent: Mar. 30, 2004

(54) METHOD FOR FABRICATING THIN-FILM SUBSTRATE AND THIN-FILM SUBSTRATE FABRICATED BY THE METHOD

(75) Inventors: Masafumi Ide, Tokorozawa (JP); Toshiyuki Sameshima, Kokubunji (JP)

(73) Assignee: Citizen Watch Co., Ltd., Nishitokyo (JP)

( * ) Notice: Subject to any disclaimer, the term of this patent is extended or adjusted under 35 U.S.C. 154(b) by 0 days.

(21) Appl. No.: 09/926,242

(22) PCT Filed: Mar. 27, 2000

(86) PCT No.: PCT/JP00/01865

§ 371 (c)(1),
(2), (4) Date: Sep. 28, 2001

(87) PCT Pub. No.: WO00/60652

PCT Pub. Date: Oct. 12, 2000

(30) Foreign Application Priority Data

Mar. 30, 1999 (JP) ............................................. 11-087634
Mar. 30, 1999 (JP) ............................................. 11-087635

(51) Int. Cl.$^7$ ......................... G03C 5/00; H01L 21/469; H01L 21/4763
(52) U.S. Cl. ...................... 430/313; 430/317; 430/318; 257/522; 257/644; 257/752; 438/619; 438/624; 438/626; 438/785; 438/787
(58) Field of Search ................................. 430/313, 317, 430/318; 204/192.15, 192.17; 257/522–752; 438/619–787

(56) References Cited

U.S. PATENT DOCUMENTS

| 4,592,628 | A |   | 6/1986 | Altman et al. ............... 350/486 |
| 4,956,619 | A |   | 9/1990 | Hornbeck .................... 330/4.3 |
| 5,461,003 | A |   | 10/1995 | Havemann et al. .......... 437/187 |
| 6,020,215 | A | * | 2/2000 | Yagi et al. ..................... 438/52 |

FOREIGN PATENT DOCUMENTS

| EP | 0 783 178 | 7/1997 |
| JP | 9-172068 | 6/1997 |
| JP | 10-107339 | 4/1998 |

OTHER PUBLICATIONS

M. B. Anand et al.; IEEE Transactions on Electron Devices, vol. 44, No. 11, pp. 1965–1971; Nov. 1997.

* cited by examiner

Primary Examiner—Mark F. Huff
Assistant Examiner—Daborah Chacko-Davis
(74) Attorney, Agent, or Firm—Westerman, Hattori, Daniels & Adrian, LLP

(57) ABSTRACT

Supports (3) are formed to be arrayed on a support base (1), a sacrifice layer (15) is formed of a resin material, and the sacrifice layer (15) is planarized so as to expose the top of the respective supports (3), thereby forming a thin-film substrate (5) on top of the sacrifice layer (15) as planarized, and the supports (3). The sacrifice layer (15) is removed by plasma selective etching thereof through the intermediary of the thin-film substrate, and thereby a large-area thin-film substrate (5) floatingly spaced by a space (7) away from the support base (1) can be fabricated.

19 Claims, 23 Drawing Sheets

METHOD FOR FABRICATING THIN-FILM SUBSTRATE AND THIN-FILM SUBSTRATE FABRICATED BY THE METHOD

TECHNICAL FIELD

The present invention relates to a method for fabricating a thin-film substrate, and a thin-film substrate fabricated by the method, and more particularly, to a method for fabricating a thin-film substrate for use in the fabrication of a microstructure, and so forth, applicable to a semiconductor device, a liquid crystal light modulator, or a MEMS (microelctromechanical system), and a structure of a thin-film substrate fabricated by the method described.

BACKGROUND TECHNOLOGY

A silicon wafer, glass substrate, or quartz substrate has so far been in widespread use as a substrate for use in fabrication of a thin-film transistor, other thin-film devices, or a MEMS. It is more often than not that these substrates are formed to a thickness in a range of several hundred μm to several mm.

These substrates which are further ground are used as an extra-thin substrate at times, and for example, a silicon wafer on the order of 10 μm in thickness can be obtained from Virginia Semiconductor Inc. (1501 Powhaten Street, Fredericksburg, Va. 22401, USA), and so forth.

Further, there are cases where a film of a polymer such as polyimide, formed on a glass substrate by the spin cast method, is used as a thin-film substrate several μm or less in thickness.

Furthermore, there are also times when a thin-film of a metal oxide and so forth, formed directly on a silicon wafer or a glass substrate by the sputtering method or the chemical vapor deposition (CVD) method, is used as a thin-film substrate.

There has been adopted another approach wherein supports are provided on a support base, and on top of the supports, a thin-film serving as a functional structure or as a substrate of the functional structure is formed.

As a conventional technique of constituting a structure so as to be spaced away from the support base, there is available a method for fabricating a movable mirror of a spatial light modulator as disclosed in U.S. Pat. No. 4,956,619.

The conventional method for fabricating the structure is described hereinafter with reference to plan views of FIGS. 44 to 47, and the steps of the method for fabricating the structure are described with reference to cross-sectional views of FIGS. 48 to 51, respectively taken on line 48—48 in FIG. 44.

As shown in FIG. 48, a spacer layer 203 a portion of which is to serve as a sacrifice layer is first applied to the top of a substrate 201 by the spin coater method, and a metal layer 205 is formed on top of the spacer layer 203. The metal layer 205 is formed of an aluminum alloy with copper added thereto in order to enable it to function as a reflecting film.

Further, the metal layer 205 is patterned by photolithography in order to form a flap 101 which is to become a pixel of a light modulator from the metal layer 205. Then, as shown in FIGS. 44 and 48, a plasma etch access gap 105, and plasma etch access holes 103 for forming the flap 101 are provided in the metal layer 205.

Subsequently, a cavity region 107 shown in FIG. 49 is formed by plasma etching based mainly on oxygen. FIG. 45 is a plan view of the flap with the cavity region 107 formed therein.

By introducing active species through the plasma etch access holes 103 and the plasma etch access gap 105, positive photoresist of the spacer layer 203 is isotropically etched, thereby forming the cavity region 107.

As etching proceeds further, the cavity region 107 expands as shown in FIGS. 46 and 50. Thereafter, as shown in FIGS. 47 and 51, etching is continued until the formation of a structure wherein the flap 101 is floatingly spaced away from the substrate 201 to be retained by the spacer layer 203. As a result of such processing as described above, the structure can be formed wherein the flap 101 is floatingly spaced away from the substrate 201.

As another method for implementing a similar structure for a light modulator, there is an example as disclosed in U.S. Pat. No. 4,592,628.

With this method, silicon (Si) is used for a spacer layer which is to serve as a sacrifice layer, and silica ($SiO_2$) obtained by oxidizing silicon is used for a thin-film structure, removing portions of the spacer layer by the wet etching method wherein an etchant capable of selectively etching silicon only such as, for example, pyrocatechol ethylenediamine is introduced through openings.

Further, as another method wherein supports are provided on a support base, a sacrifice layer is made use of in order to form a thin-film serving as a functional structure or a substrate of the functional structure on top of the supports, and the sacrifice layer is removed by etching through openings, there is disclosed a method for removing the sacrifice layer by a vapor phase etching method in "JP, 10-107339, A".

However, the conventional silicon wafer, glass substrate, or quartz substrate for use in the fabrication of the thin-film transistor, other thin-film devices or MEMS has often been on the order of several hundred μm to several mm in thickness.

Accordingly, in the case of using these substrates, for example, when applying heat treatment to a device or structure formed thereon, there has arisen a problem in that heat treatment can not be effectively applied thereto because an object being for heat treated on these substrates is often made up of a thin film of several μm or less in thickness, and heat is dissipated from the object for being heat treated to these substrates although heat capacity of the former is very small. Further, in the case of forming a thin metal film for forming wiring, another problem has been encountered in that the thin metal film needs to be insulated and retained by a dielectric film having dielectric constant at least several times greater than that of air or vacuum, and consequently, a large floating capacity is added to wiring in a high-frequency circuit.

The problems described above also occur to a substrate wherein an inorganic or organic thin film is formed directly on the silicon wafer, glass substrate, or so forth.

Further, as a particularly thin substrate, there is available a silicon wafer, for example, on the order of 10 μm in thickness, obtained by further grinding these substrates, but the silicon wafer is weak in mechanical strength, requiring special care in handling and transportation, and it is physically difficult to render the same further thinner, which limits a range of application thereof.

Accordingly, as a method for making the most of the function of a thin film, it is conceivable to make use of a process wherein supports are provided on a support base, and on top of the supports a thin-film serving as a functional structure or as a substrate of the functional structure is formed as practiced in a method for fabricating the MEMS having a space structure such as, for example, a DMD (digital micromirror device).

With the process proposed so far, however, there has been adopted a method wherein a thin film is formed on top of a spacer layer which is to serve as a sacrifice layer, and the sacrifice layer is removed by plasma etching, wet etching, or gas phase etching through openings provided in the thin film.

In such a case, since etching of the sacrifice layer proceeds mainly only in the traverse direction through the openings, a multitude of the openings are required. An area of the sacrifice layer, normally removable by one of the openings, is practically on the order of several thousand $\mu m^2$ owing to a low etching rate in the traverse direction.

There have recently been seen tendencies for a semiconductor integrated circuit (IC), a circuit board, and further, a MEMS, and so forth, formed on a silicon wafer, glass substrate, or so forth, to increase in scale and size, and to become higher in density, and consequently, a thin film having a relatively large area is often used as a substrate. However, a thin film provided with a multitude of openings will become unsuitable for such application.

It is therefore an object of the invention to enable a thin film substrate having an area even as large as several $mm^2$ or 10 $mm^2$ or more to be formed in such a way as to be floatingly spaced away from, and retained by a support base.

DISCLOSURE OF THE INVENTION

To this end, the invention provides a method for fabricating a thin-film substrate, wherein the thin-film substrate is fabricated on top of supports arrayed on a support base so as to be spaced away from the support base, said method comprising the steps of:

forming the supports in a predetermined shape on the support base;

forming a sacrifice layer made of a resin material on the support base;

planarizing the sacrifice layer so as to expose the top of the respective supports;

forming a thin-film substrate on top of the sacrifice layer as planarized; and removing the sacrifice layer by plasma selective etching through the intermediary of the thin-film substrate.

The method for fabricating the thin-film substrate described above may further comprise a step of forming an opening functioning as a discharge port of a volatile gas evolved as a result of the plasma selective etching in the thin-film substrate formed on top of the sacrifice layer, between the step of forming the thin-film substrate and the step of removing the sacrifice layer.

Further, the supports are preferably formed in the shape of a pillar such as a cylinder, prism, or so forth, or in a shape of a wall such as a cuboid or so forth.

If the supports are formed of an electrically conductive material, this can promote etching in the step of removing the sacrifice layer by the plasma selective etching.

The thin-film substrate may be formed of an insulating material.

In the step of forming the supports in the predetermined shape on the support base, it is preferable to form a metal film on the support base, and to form the supports in the predetermined shape by applying photolithography and etching treatment to the metal film.

In the step of removing the sacrifice layer by the plasma selective etching through the intermediary of the thin-film substrate, the sacrifice layer is preferably removed by plasma selective etching based mainly on a reactive gas containing oxygen or oxygen atoms through the intermediary of the thin-film substrate. A total pressure applied at this time is preferably 100 Pa or more.

Further, the sacrifice layer is preferably formed of material containing acrylic resin as the main constituent thereof or a photoresist material.

Another preferred embodiment of a method for fabricating a thin-film substrate according to the invention comprises the steps of:

forming a metal film on the support base by the sputtering method;

forming the supports in a predetermined shape by applying photolithography and etching treatment to the metal film;

forming a sacrifice layer by applying a resin material containing acrylic resin as the main constituent onto the support base by means of the spin coater method;

planarizing the sacrifice layer by etching the same through a plasma treatment so as to expose the top of the respective supports;

forming the thin-film substrate made of an insulating material on top of the sacrifice layer as planarized; and removing the sacrifice layer by plasma selective etching based mainly on a reactive gas containing oxygen or oxygen atoms with a total pressure at 100 Pa or more through the intermediary of the thin-film substrate.

The method for fabricating the thin-film substrate described above may also further comprise a step of forming an opening functioning as a discharge port of a volatile gas evolved as a result of the plasma selective etching in the thin-film substrate formed on top of the sacrifice layer, between the step of forming the thin-film substrate and the step of removing the sacrifice layer.

A base formed of material containing silica ($SiO_2$) as the main constituent thereof or material containing silicon (Si) as the main constituent thereof is preferably used for the support base.

A support base formed of material containing silica ($SiO_2$) or silicon (Si) as the main constituent thereof with a metal oxide thin-film formed thereon may be used for the support base.

In this case as well, the supports are preferably formed in the shape of a pillar, or in the shape of a wall.

The thin-film substrate is preferably formed of material containing tantalum oxide ($TaO_x$) as the main constituent thereof, or material containing silicon oxide ($SiO_x$) as the main constituent thereof.

Further, in the step of forming the metal film on the support base, the metal film is preferably formed of material containing molybdenum (Mo) as the main constituent thereof.

Further, in accordance with another aspect of the invention, a method for fabricating a thin-film substrate may comprise steps similar to those previously described, whereby the supports in a predetermined shape and a sacrifice layer are formed on a support base, the sacrifice layer is planarized so as to expose the top of the respective supports, subsequently, a porous film is formed on the sacrifice layer as planarized, and the sacrifice layer is removed by plasma selective etching through the intermediary of the porous film before forming the thin-film substrate on the porous film.

Because the plasma selective etching is carried out through the intermediary the porous film according to this method for fabricating the thin-film substrate, an etching rate can be increased, time required for the removal of the sacrifice layer can be shortened, and the thin-film substrate can be supported with greater certainty.

Further, the invention provides a thin-film substrate fabricated by each of the previously described method for fabricating the thin-film substrate.

With the methods for fabricating the thin-film substrate according to the invention, on the support base to be a supporting member for the thin-film substrate, the supports for supporting the thin-film substrate, and the sacrifice layer for forming the thin-film substrate so as to be floatingly spaced away from the support base are formed, and the sacrifice layer is planarized. The thin-film substrate is formed on top of the sacrifice layer, and only the sacrifice layer is selectively removed by carrying out the plasma selective etching on predetermined conditions through the intermediary of the thin-film substrate.

At this point in time, since the plasma selective etching of the sacrifice layer proceeds through the thin-film substrate, there is no particular need of providing openings, and even if the openings are provided, only a few thereof will suffice. Accordingly, there is few limitations to an area of the thin-film substrate to be formed, and the thin-film substrate having a large area, for example, a several ten mm square or more, can be formed so as to be floatingly spaced away from the support base by virtue of the supports.

Although there remain many obscure points to a detailed mechanism of the plasma selective etching of the sacrifice layer proceeding through the thin-film substrate, the inventors are of the following opinion.

In the case of using an organic film such as positive photoresist, acrylic resin, or so forth for a constituent material of the sacrifice layer, the plasma selective etching can be implemented by use of a gas containing oxygen. For example, an assumption is made that the sacrifice layer composed of acrylic resin is etched by oxygen as an etching gas.

If etching by excitation of an oxygen gas is carried out in an etching chamber having a parallel plate type electrode structure with the use of a 13.56 MHz RF power supply source, etching proceeds isotropically under pressure at several hundred Pa. As active species of the etching at this time, oxygen ion, neutral atomic oxygen, and oxygen radical are conceivable.

The thin-film substrate made of an insulating material such as tantalum pentaoxide ($Ta_2O_5$), formed on top of the sacrifice layer by sputtering, is not etched by oxygen plasma, however, in the case where the thin-film substrate is of several hundred nm or less in thickness, upon etching thereof by oxygen plasma, a portion of active species in the oxygen plasma is allowed to pass through the thin-film substrate because it is sufficiently thin, and the portion of the active species, passed therethrough, will reach the sacrifice layer, thereby starting reaction with the outermost surface of resin.

As a result, reaction products such as $CO_2$ gas, $H_2O$ gas are generated at the interface between the thin-film substrate and the resin. Transformation of the acrylic resin in a solid form into gas taking place at the interface will cause substantial expansion in volume, and pressure built up as a result acts as a driving force to discharge the reaction products to the outside of the thin-film substrate therethrough.

When the pressure reaches a state of equilibrium, the active species in the plasma are supplied to the surface of the resin through the thin-film substrate from the outside thereof, and thereby reaction occurs between the resin and the active species, so that the etching of the sacrifice layer proceeds. Small gaps developed at the interface between the thin-film substrate and the resin gradually expand, eventually forming a space.

Further, the inventors have discovered that in the case of forming the supports for retaining the thin-film substrate from an electrically conductive material such as, for example, molybdenum (Mo), the etching proceeds at a high rate, particularly from the vicinity of the respective supports.

In view of the fact that such a phenomenon is not observed in the case of using an insulating material for the supports, it is presumed that the supports as electrically charged during plasma discharge play a role of increasing concentration of the active species in the vicinity of the respective supports due to some action thereof, and a supply rate of the active species through the thin-film substrate, in the vicinity of the respective supports, is accelerated, thereby causing the phenomenon to occur.

Consequently, an etching rate in the case of using an electrically conductive material for the supports is substantially increased as compared with the case of using an insulating material for the supports. Hence, the former is suitable particularly in the case of fabricating a thin-film substrate having a large area.

Further, since the etching of the sacrifice layer is implemented through the thin-film substrate, the thinner the thickness of the thin-film substrate, the higher an etching rate becomes.

Furthermore, the higher a pressure of a gas introduced, the higher an etching rate becomes. For example, in the case of employing the supports having insulating properties, the etching through the thin-film substrate hardly proceeds at a pressure not higher than about 70 Pa or less, however, the etching rate is increased substantially in proportion to a pressure level in a range of about one hundred Pa to several kPa.

BEST MODE FOR CARRYING OUT THE INVENTION

Preferred embodiments of a method for fabricating a thin-film substrate according to the invention, and a thin-film substrate fabricated by the method, will be described hereinafter with reference to the accompanying drawings.
First Embodiment: FIGS. 1 to 18

A first embodiment of the invention is described with reference to FIGS. 1 to 18.

Figure 1:
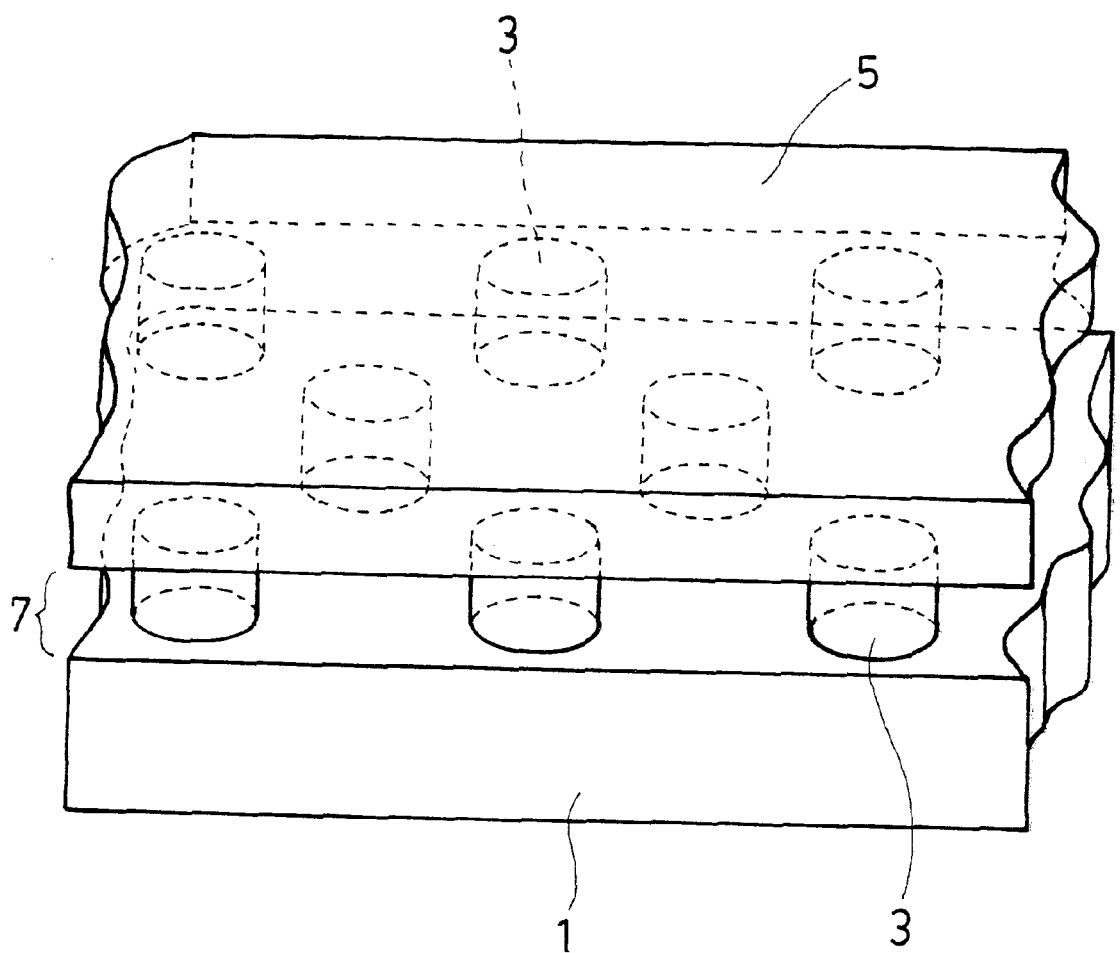
FIG. 1 is a schematic perspective view showing a thin-film substrate fabricated by a first embodiment of a method for fabricating a thin-film substrate according to the invention, and support members thereof.

First, a constitution of a thin-film substrate fabricated by the first embodiment of a method for fabricating a thin-film substrate according to the invention is described with reference to FIGS. 1 to 3. FIG. 1 is a schematic perspective view showing the thin-film substrate and support members thereof.

A thin-film substrate 5 shown in FIG. 1 is disposed on supports 3 cylindrical in shape, arrayed on a support base 1, and a space 7 is provided between the thin-film substrate 5 and the support base 1, so that the thin-film substrate 5 is spaced (floatingly) by the height of the space 7 away from the support base 1, and retained by a multitude of the supports 3 cylindrical in shape.

Figure 2:
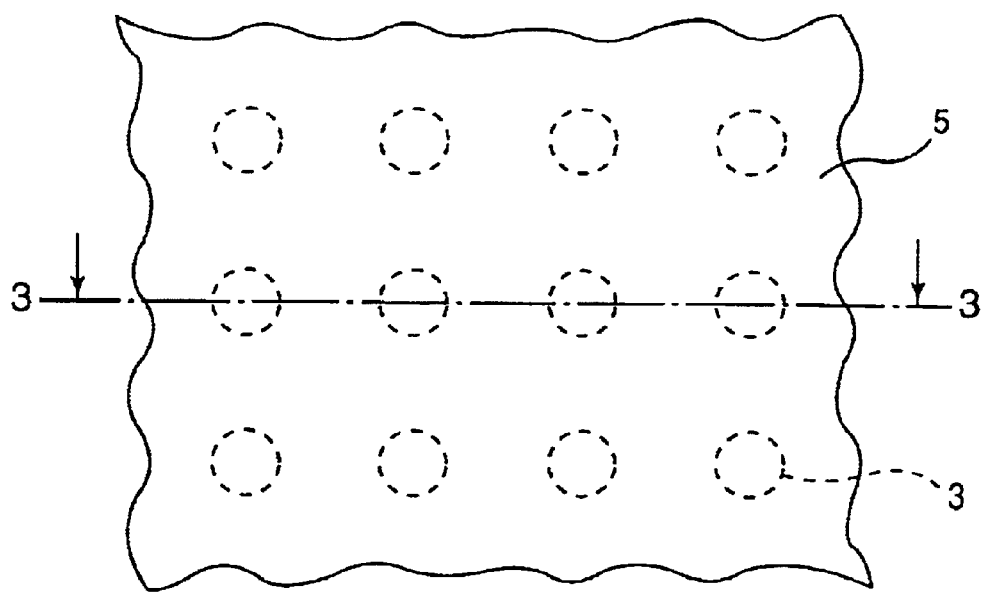
FIG. 2 is a plan view showing a portion of the thin-film substrate.
Figure 3:
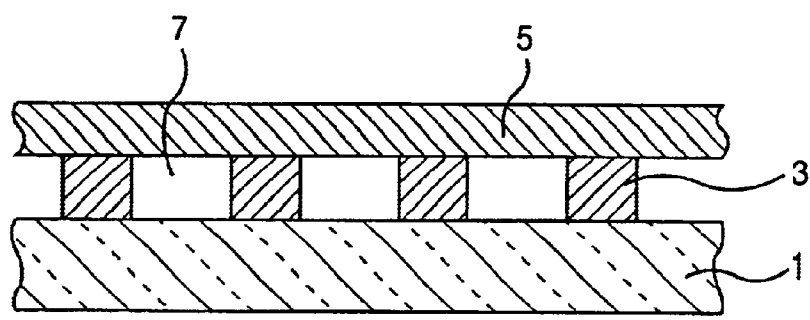
FIG. 3 is a cross-sectional view taken on line 3—3 of FIG. 2.

FIG. 2 is a plan view showing a portion of the thin-film substrate, and FIG. 3 is a cross-sectional view taken on line 3—3 of FIG. 2.

With this embodiment, a multitude of the supports 3 cylindrical in shape are arrayed in a manner like a square matrix on the support base 1. As to a typical value of the size of the respective supports 3 cylindrical in shape, and that of a spacing therebetween, the diameter thereof and the spacing may be in a range of 1 $\mu$m or less to several hundred $\mu$m, and the height thereof may be in a range of 1 $\mu$m or less to several tens of $\mu$m. Further, the supports 3 may be in the shape of a pillar having an optional shape in section such as a prism, and so forth.

Now, the first embodiment of the method for fabricating the thin-film substrate according to the invention is described with reference to FIGS. 4 to 10. This represents the method for fabricating the thin-film substrate described above, and a specific example is described in detail hereinafter wherein the supports 3 are formed in the shape of a cylinder 8 $\mu$m in diameter, and 2.5 $\mu$m in height, and are arrayed in the manner like the square matrix arranged at a pitch of 18 $\mu$m. FIGS. 4 to 10 are cross-sectional views similar to FIG. 3, showing respective steps of the method for fabricating the thin-film substrate.

Figure 4:
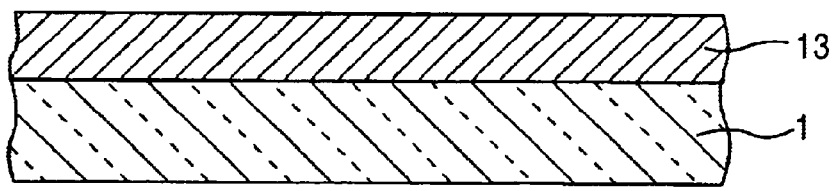
FIGS. 4 to 10 are cross-sectional views similar to FIG. 3, showing respective steps of the first embodiment of the method for fabricating the thin-film substrate according to the invention.

First, as shown in FIG. 4, a support material 13 made of molybdenum is formed to a thickness of 2.5 $\mu$m on the support base 1 made up of a glass substrate, by sputtering molybdenum (Mo) as a target metal by use of a magnetron-sputtering system.

Operating conditions adopted at this time are as follows.
total pressure: 0.8 Pa (pascal)
gas introduced and a flow rate: Ar, 90 sccm
density of power turned on: 3.9 W/cm$^2$
substrate temperature: 150° C.

Figure 5:
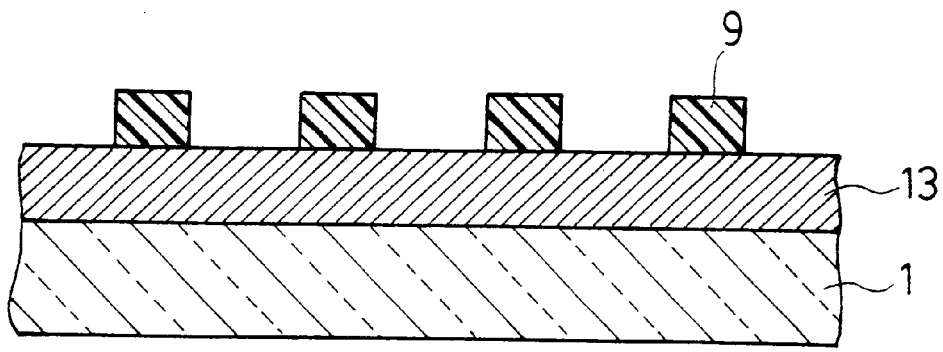

Next, as shown in FIG. 5, positive photoresist 9 is formed on the support material film 13 by ordinary photolithography treatment so as to match the shape and array position of the respective supports 3.

Figure 6:
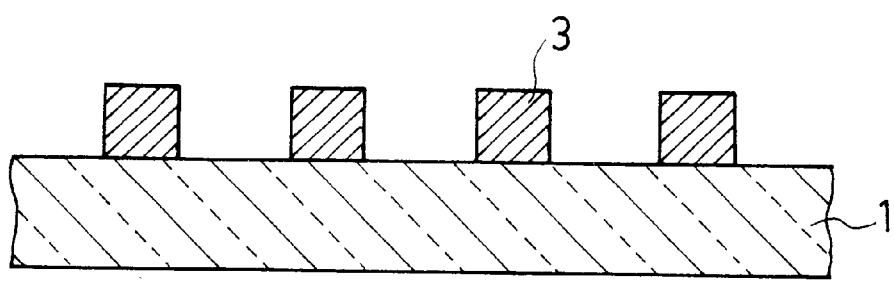

Subsequently, by dry etching using a gas containing sulfur hexafluoride (SF$_6$) as the main constituent thereof with the use of a parallel plate type 13.56 MHz RF excited etching system while using the positive photoresists 9 as masks, molybdenum (Mo) of the support material film 13 is etched, thereby forming the multitude of the supports 3 cylindrical in shape so as to be arrayed on the support base 1 as shown in FIG. 6.

Figure 7:
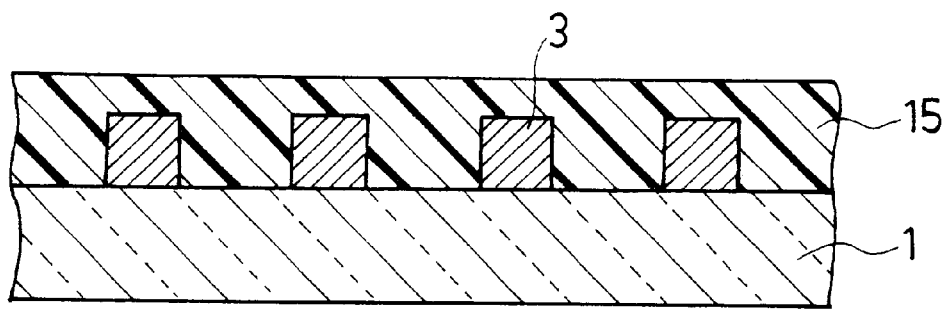

Operating conditions adopted at this time are as follows.
total pressure: 9.3 Pa (pascal)
gas introduced and a flow rate:
SF$_6$, 300 sccm
O$_2$, 23 sccm
He, 8 sccm
density of power turned on: 0.56 W/cm$^2$ Thereafter, as shown in FIG. 7, a resin material for composing a sacrifice layer 15 is applied by the spin coater method to a thickness about 3.5 $\mu$m such that the top of the respective supports 3 is completely buried therein.

For the resin material, use is made of "V −259 PA" which is an acrylic negative resist, manufactured by Nippon Steel Chemical Co., Ltd. Application conditions thereof are that it is applied for 15 seconds at 600 rpm. Further, the resin material is baked at 220° C. in the atmosphere for 90 minutes, thereby forming the sacrifice layer 15 to a thickness about 2.8 $\mu$m.

Figure 8:
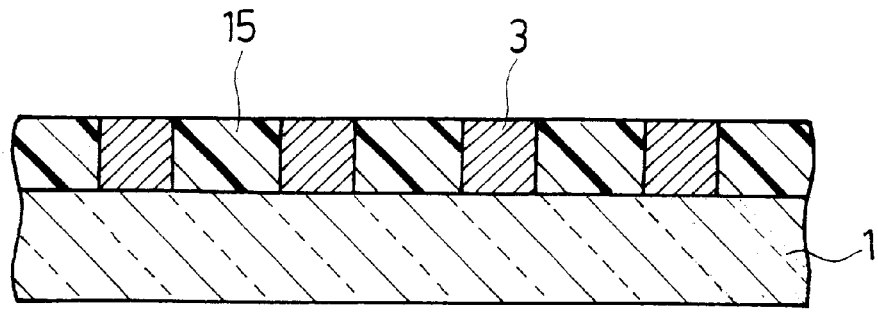

Then, as shown in FIG. 8, the sacrifice layer 15 is etched back by use of a gas containing oxygen as the main constituent thereof until the tops of the supports 3 are exposed for planarization.

Figure 9:
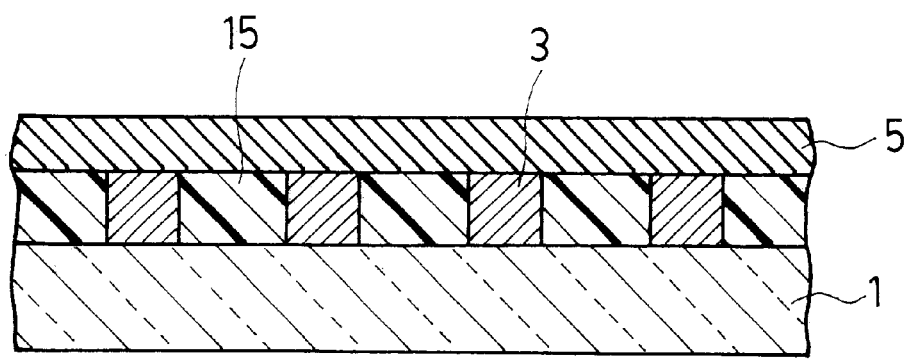

Operating conditions adopted at this time are as follows.
total pressure: 27 Pa (pascal)
gas introduced and a flow rate:
   $O_2$, 100 sccm
   He, 50 sccm
   0.22 W/cm$^2$
density of power turned on:

Subsequently, as shown in FIG. 9, a thin-film substrate 5 having insulating property, made of tantalum pentaoxide ($Ta_2O_5$), is formed to a thickness about 200 □m by 13.56 MHz RF excited sputtering with $Ta_2O_5$ as a target metal of the sputtering so as to cover the sacrifice layer 15 as planarized and the tops of the supports 3.

Operating conditions adopted at this time are as follows.
total pressure: 0.67 Pa (pascal)
gas introduced and a flow rate:
   Ar, 68 sccm
   $O_2$, 2 sccm
density of power turned on: 3.3 W/cm$^2$
substrate temperature: no particular heating is applied.

Figure 10:
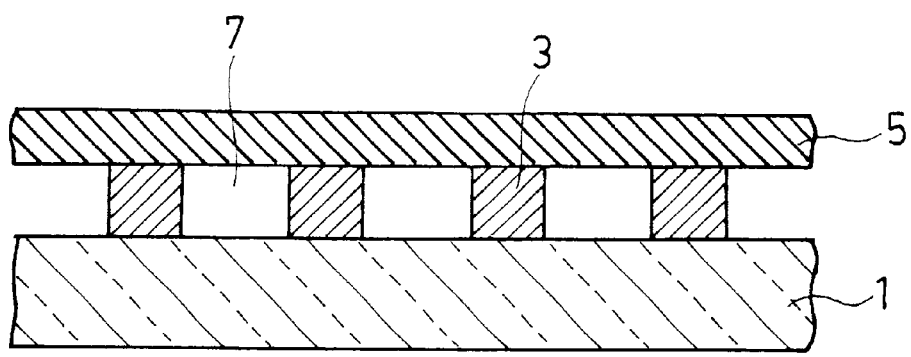

Finally, as shown in FIG. 10, plasma etching by oxygen plasma is applied to the sacrifice layer 15 through the intermediary of the thin-film substrate 5 to selectively etch and remove the sacrifice layer 15, thereby providing the space 7 between the thin-film substrate 5 and the support base 1 to form the thin-film substrate 5. For this etching, the parallel plate type 13.56 MHz RF excited etching system is employed.

A typical example of operating conditions adopted at this time (conditions of a plasma selective etching) is shown as follows.
   total pressure: 100 to 1500 Pa (pascal)
   gas introduced and a flow rate: $O_2$, 100 sccm
   density of power turned on: 4.5 W/cm$^2$
   substrate temperature: 100° C.
   distance between parallel plate electrodes: 10 to 40 mm By taking processing steps described above, the thin-film substrate 5 according to this embodiment is completed.

Because the method for fabricating the thin-film substrate according to the invention is characterized particularly by the plasma selective etching of the sacrifice layer 15, applied in the case of using an electrically conductive material for the supports 3, the plasma selective etching is described in more details hereinafter with reference to FIGS. 11 to 18.

Figure 11:
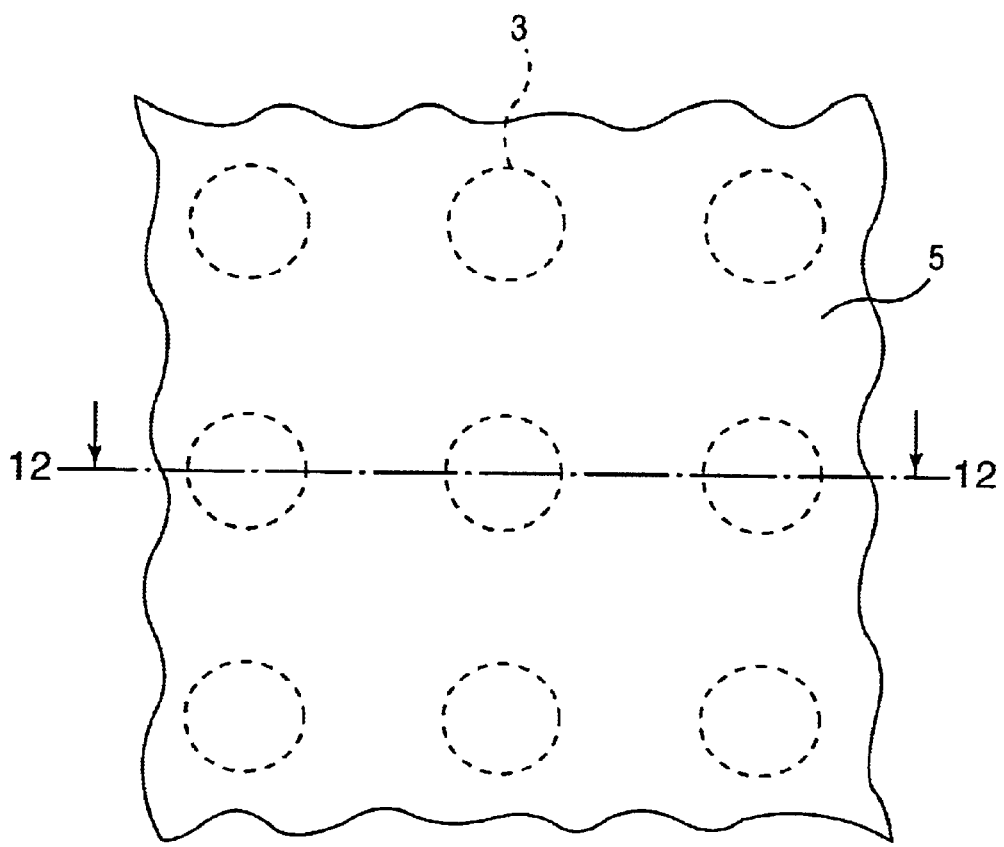
FIGS. 11 to 18 are plan views, and cross-sectional views of the respective plan views, for illustrating in detail plasma selective etching of a sacrifice layer, starting from a state of a workpiece, shown in FIG. 9.
Figure 12:
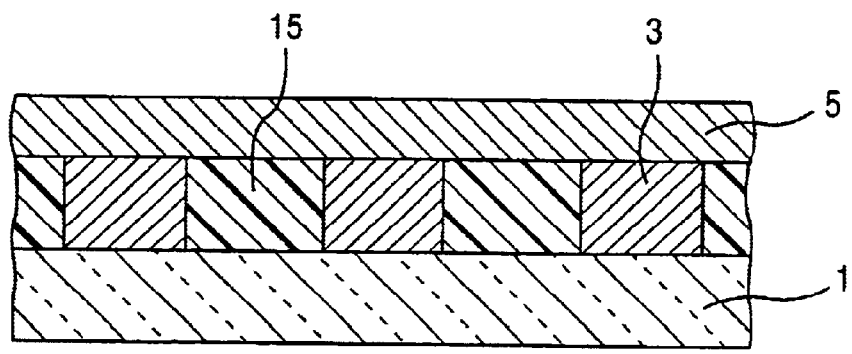

FIG. 11 is a plan view showing a processing stage prior to the removal of the sacrifice layer 15 (the condition as shown in FIG. 9) in carrying out the method for fabricating the thin-film substrate according to the invention, and FIG. 12 is a cross-sectional view taken on line 12—12 of FIG. 11.

At this stage, the multitude of the supports 3 are formed so as to be arrayed in the manner like the square matrix on the support base 1, and an interspace among the respective supports 3 is completely filled up with the sacrifice layer 15 which is planarized. Further, the thin-film substrate 5 is formed on top of the sacrifice layer 15 and the supports 3.

Figure 13:
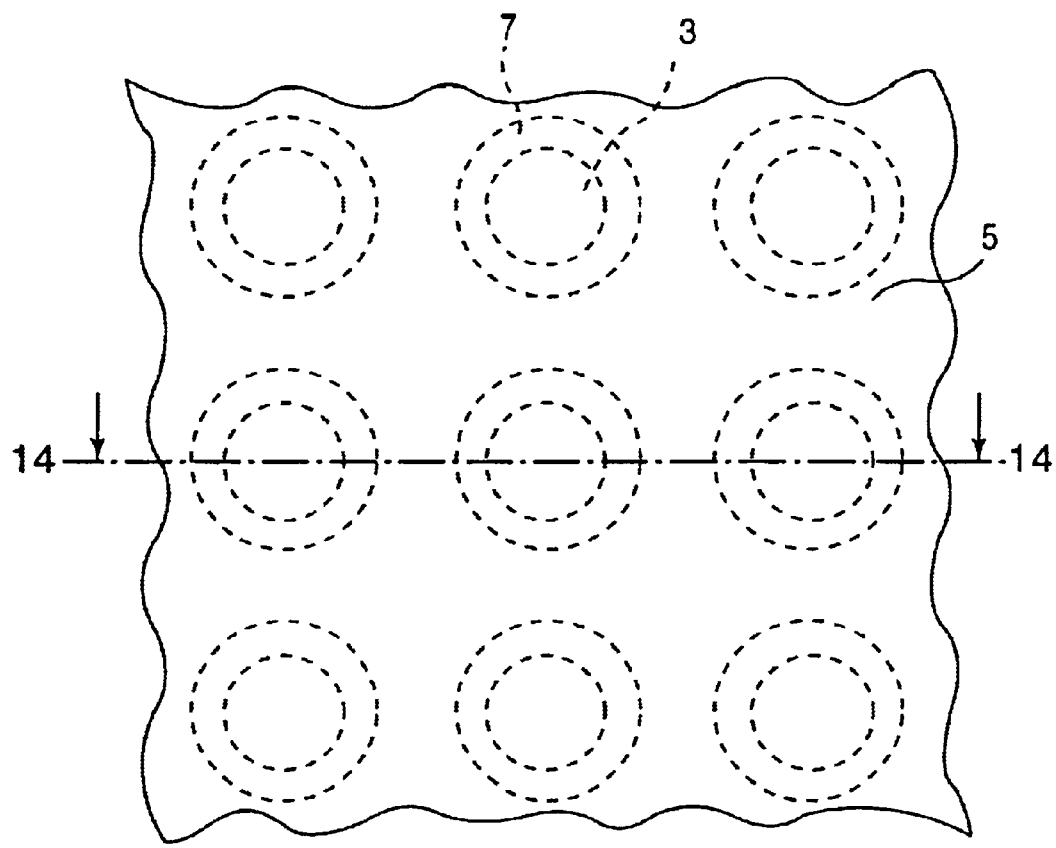

With a workpiece in such a state as described above, upon applying dry etching from the surface side of the thin-film substrate 5 on condition of plasma selective etching using a gas containing oxygen as the main constituent thereof, etching of the sacrifice layer 15 starts from portions of the sacrifice layer 15, around the respective supports 3 so as to form spaces 7, each in a shape similar to the outer boundary of the respective supports 3 cylindrical in shape, as shown in a plan view of FIG. 13.

Figure 14:
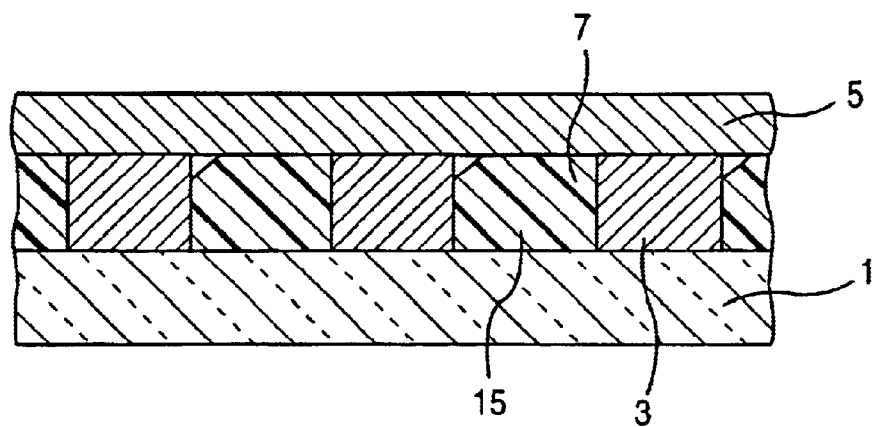

At this point in time, as shown in FIG. 14 which is a cross-sectional view taken on line 14—14 of FIG. 13, the etching proceeds from the portions of the sacrifice layer 15, around the respective supports 3, on the upper side thereof closer to the thin-film substrate 5, and thereby the spaces 7 are formed.

Figure 15:
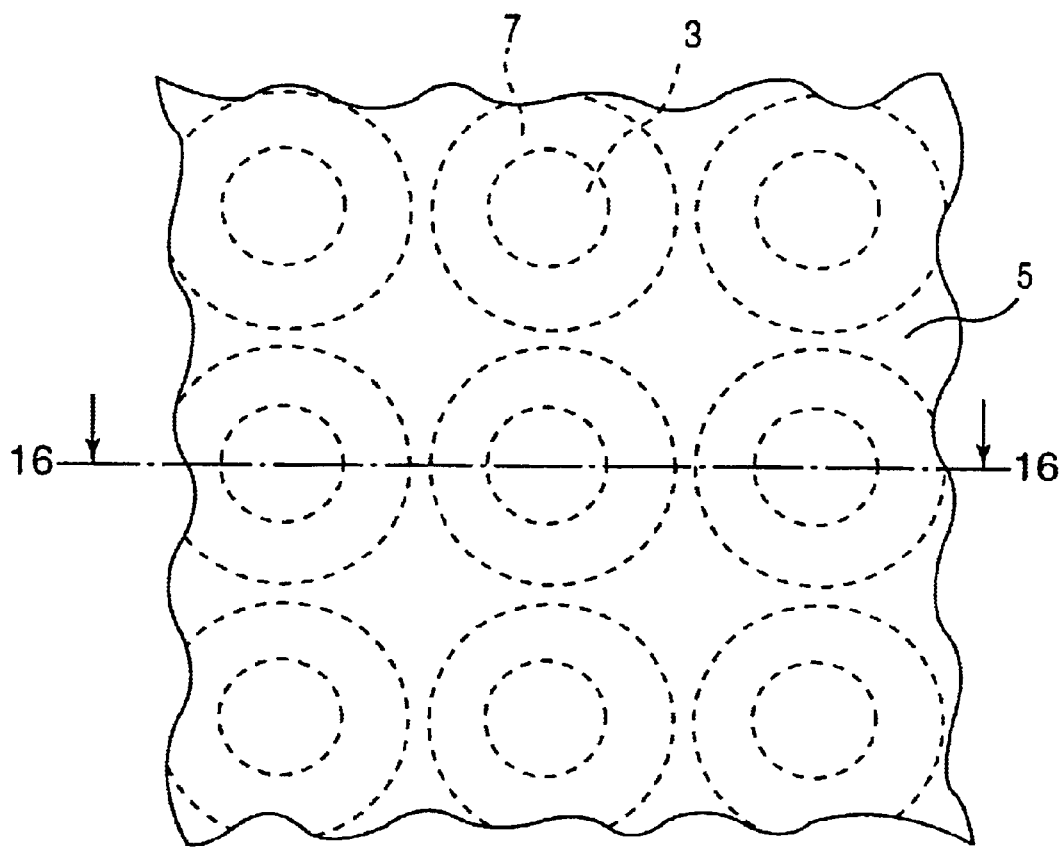
Figure 16:
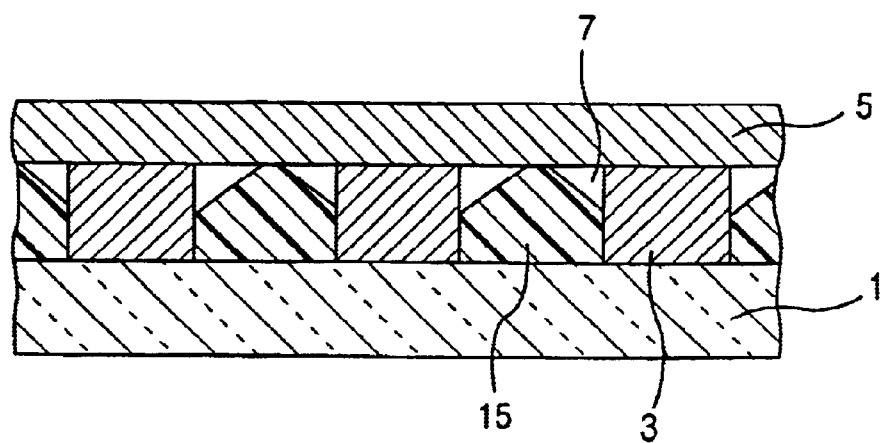

Further, upon continuation of the etching, the spaces 7 are further expanded as shown in a plan view of FIG. 15, and in FIG. 16 which is a cross-sectional view taken on line 16—16 of FIG. 15.

Figure 17:
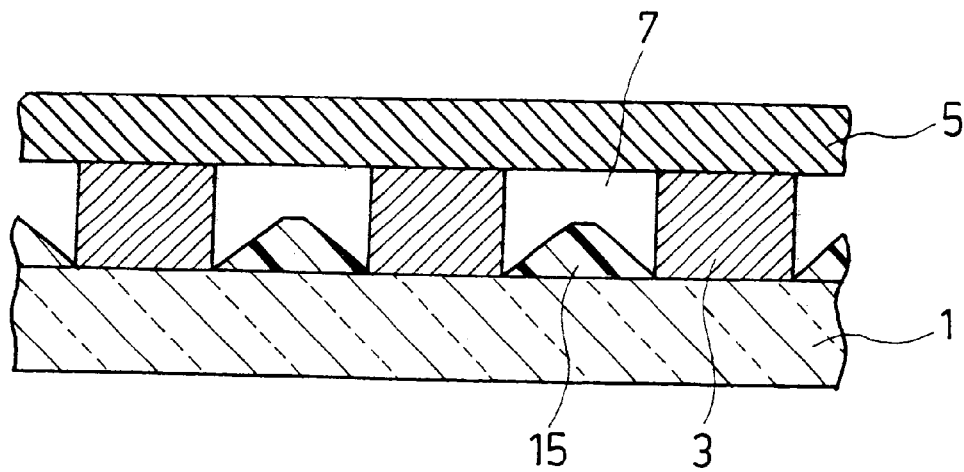

Upon further continuation of the etching, as shown in FIG. 17, the spaces 7 in the vicinity of the supports 3, adjacent to each other, are joined with each other, thereby causing the etching to proceed further.

Figure 18:
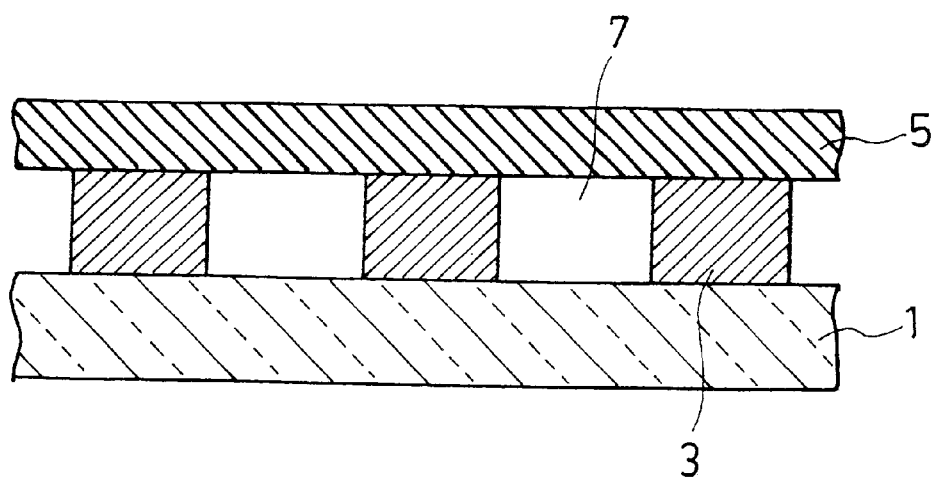

Thereafter, upon still further continuation of the etching, the sacrifice layer 15 is completely removed as shown in FIG. 18, so that the thin-film substrate 5 spaced by the space 7 away from the support base 1 is formed.

As is evident from the foregoing description, with the method for fabricating the thin-film substrate according to the invention, the plasma selective etching of the sacrifice layer 15 is implemented by exchange between active species and volatile reaction products through the thin-film substrate 5. Particularly, in the case of using the electrically conductive material for the supports 3, the selective etching proceeds at a high etching rate starting from the vicinity of the outer boundary of the respective supports 3.

As a result, with the thin-film substrate fabricated by the method for fabricating the thin-film substrate according to the invention, there is no particular need of providing openings, so that the thin-film substrate having a large area, structured in such a way as to be floatingly spaced away from the support base, can be formed with ease.

Figure 19:
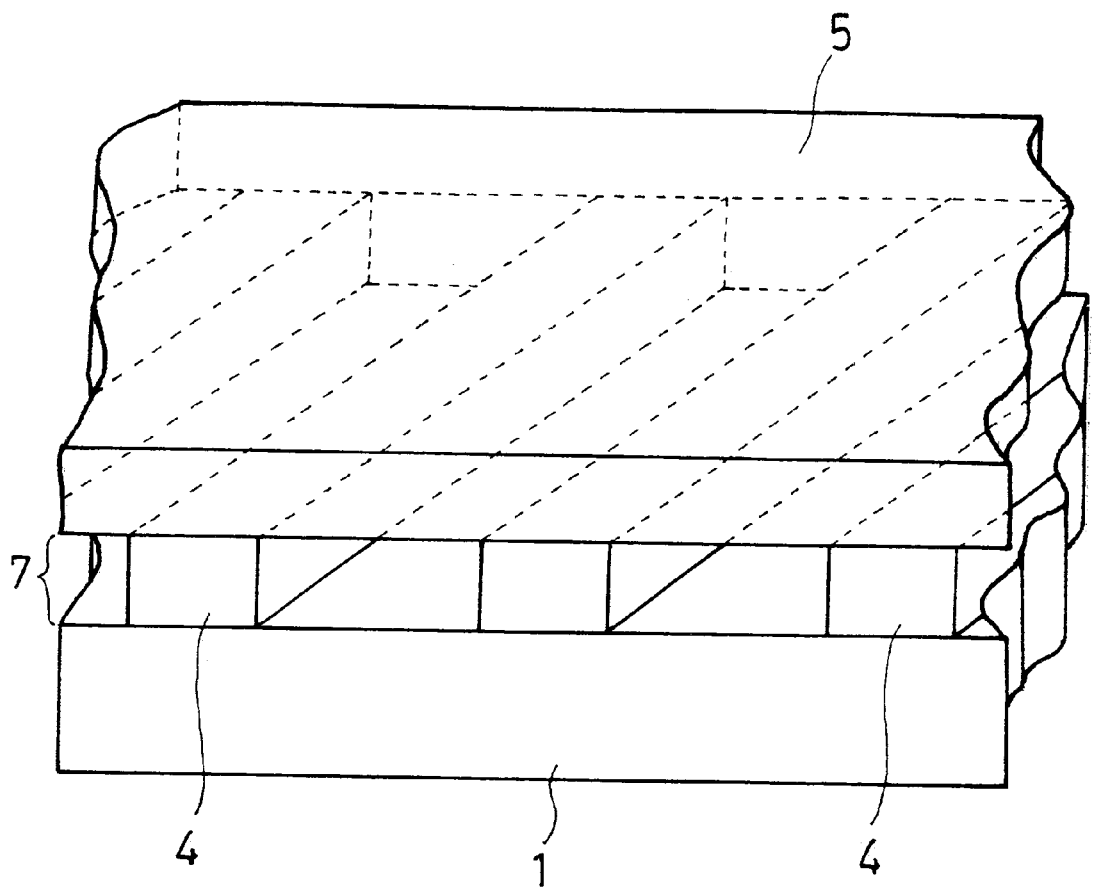
FIG. 19 is a schematic perspective view showing a thin-film substrate fabricated by a second embodiment of a method for fabricating a thin-film substrate according to the invention, and support members thereof.
Figure 20:
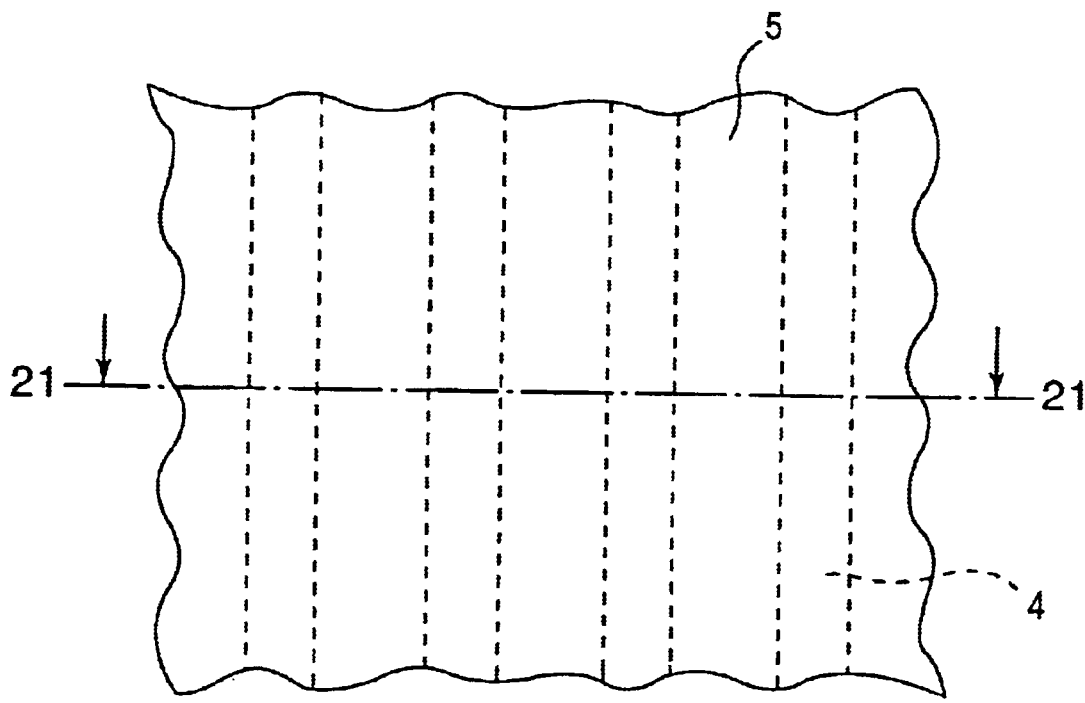
FIG. 20 is a plan view showing a portion of the thin-film substrate.
Figure 21:
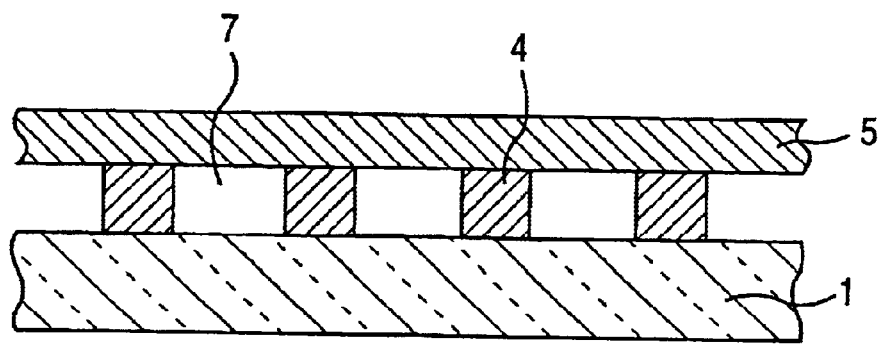
FIG. 21 is a cross-sectional view taken on line 21—21 of FIG. 20.

Second Embodiment: FIGS. 19 to 21

Next, a second embodiment of the invention is described with reference to FIGS. 19 to 21.

FIG. 19 is a schematic perspective view showing a thin-film substrate fabricated by the second embodiment of a method for fabricating a thin-film substrate according to the invention, and support members thereof. FIG. 20 is a plan view the thin-film substrate, and FIG. 21 is a cross-sectional view taken on line 21—21 of FIG. 20. In these figures, parts corresponding to those in FIGS. 1 to 3 are denoted by like reference numerals.

With the first embodiment previously described, the supports for supporting the thin-film substrate are formed in the shape of a cylinder. However, the supports need not be cylindrical in shape. Accordingly, with the second embodiment of the invention, an example wherein supports are formed in a shape of a cuboid wall is described hereinafter.

That is, with the second embodiment, as shown in FIGS. 19 to 21, the supports 4 made of an electrically conductive material such as molybdenum (Mo) or so forth are formed in the shape of the cuboid wall on a support base 1 which is a glass substrate, and are arrayed at given intervals. A thin-film substrate 5 is formed on top of the supports 4 in the shape of the wall, with spaces 7 provided between the thin-film substrate 5 and the support base 1.

Consequently, the thin-film substrate 5 has a structure wherein the thin-film substrate 5 is floatingly spaced away from the support base 1 by spaces 7 except portions thereof, in contact with the supports 4 in the cuboid shape.

Respective steps of the method for fabricating the thin-film substrate according to this embodiment of the invention are the same as those for the previously described first embodiment except that the supports 4 are formed in the shape of the cuboid wall, therefore description thereof is omitted.

Figure 22:
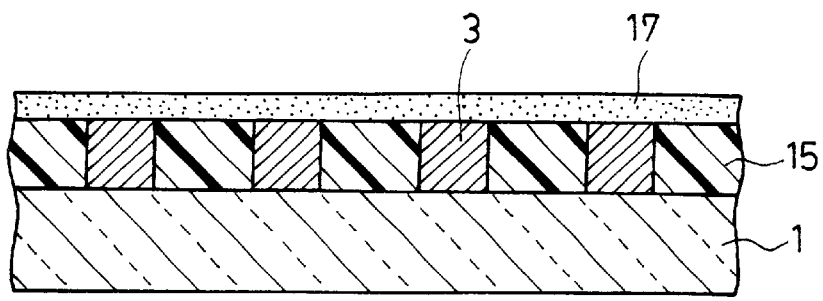
FIGS. 22 to 24 are cross-sectional views similar to FIG. 3, showing respective steps of a third embodiment of a method for fabricating a thin-film substrate according to the invention, differing from those for the first embodiment.
Figure 23:
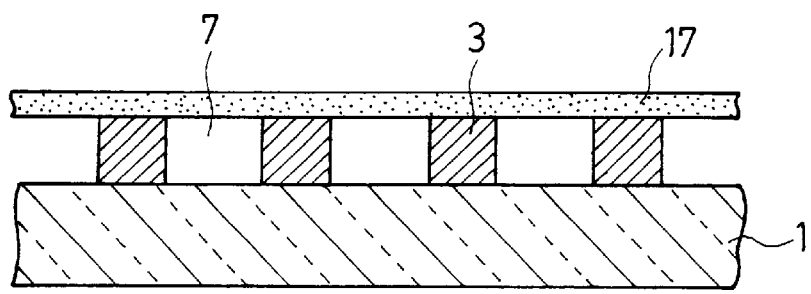
Figure 24:
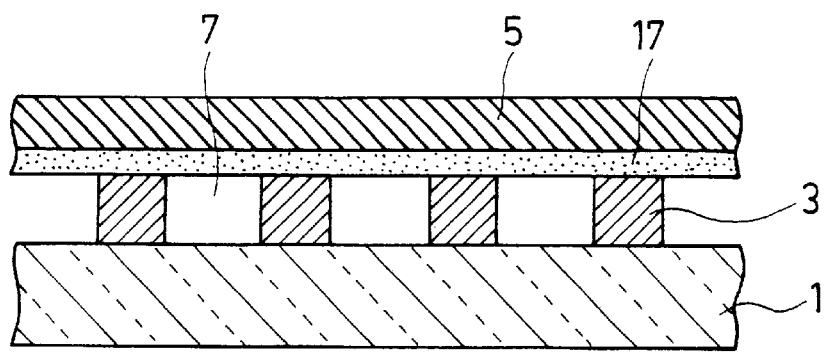

Third Embodiment: FIGS. 22 to 24

Next, a third embodiment of the invention is described with reference to FIGS. 22 to 24. In these figures, parts corresponding to those in FIGS. 8 to 10 are denoted by like reference numerals.

The third embodiment of a method for fabricating a thin-film substrate according to the invention is characterized in that instead of forming a thin-film substrate 5 directly on top of the sacrifice layer 15 as planarized, a porous film 17 is first formed on top of the sacrifice layer 15, and the sacrifice layer 15 is removed by plasma selective etching through the intermediary of the porous film 17 before forming the thin-film substrate 5 as required on the porous film 17.

In the case of this embodiment as well, similarly to the respective steps of the first embodiment previously described with reference to FIGS. 4 to 8, supports 3 cylindrical in shape, made of an electrically conductive material such as molybdenum (Mo) or so forth, are formed so as to be arrayed on a support base 1 made up of a glass substrate, the sacrifice layer 15 made of a resin material such as an acrylic negative resist is formed on the support base 1, and the sacrifice layer 15 is planarized so as to allow the top of the respective supports 3 to be exposed.

Subsequently, as shown in FIG. 22, the porous film 17 thinner than the thin-film substrate is formed on the entire upper surface of the sacrifice layer 15 as planarized and that of the supports 3. The porous film 17 can be formed by oblique angle vapor deposition of, for example, silicon dioxide ($SiO_2$).

Thereafter, as shown in FIG. 23, the sacrifice layer 15 is removed by plasma selective etching through the porous film 17, similarly to the case of the first embodiment. In this case as well, etching of the sacrifice layer 15 proceeds starting from portions thereof closer to the porous film 17, around the respective supports 3 made of an electrically conductive material, however, since exchange between active species and volatile reaction products through the porous film 17 is rendered easier as compared with the case of the plasma selective etching carried out through the thin-film substrate 5 which is nonporous, an etching rate is increased.

After completing removal of the sacrifice layer 15, the thin-film substrate 5 having insulating properties is formed to a thickness about 200 nm on the entire surface of the porous film 17 by sputtering with tantalum pentaoxide ($Ta_2O_5$) or so forth.

According to this embodiment, the etching rate at which the sacrifice layer 15 is removed can be increased, and the thin-film substrate 5 can be supported with more certainty by virtue of the porous film 17.

It is further to be pointed out that the shape of the supports is not limited to a cylinder, and may be changed to a suitable one such as a prism, other pillars, or a shape of a cuboid wall as with the previously described embodiments.

Fourth Embodiment: FIGS. 25 to 39

Next, a fourth embodiment of the invention is described with reference to FIGS. 25 to 39.

Figure 25:
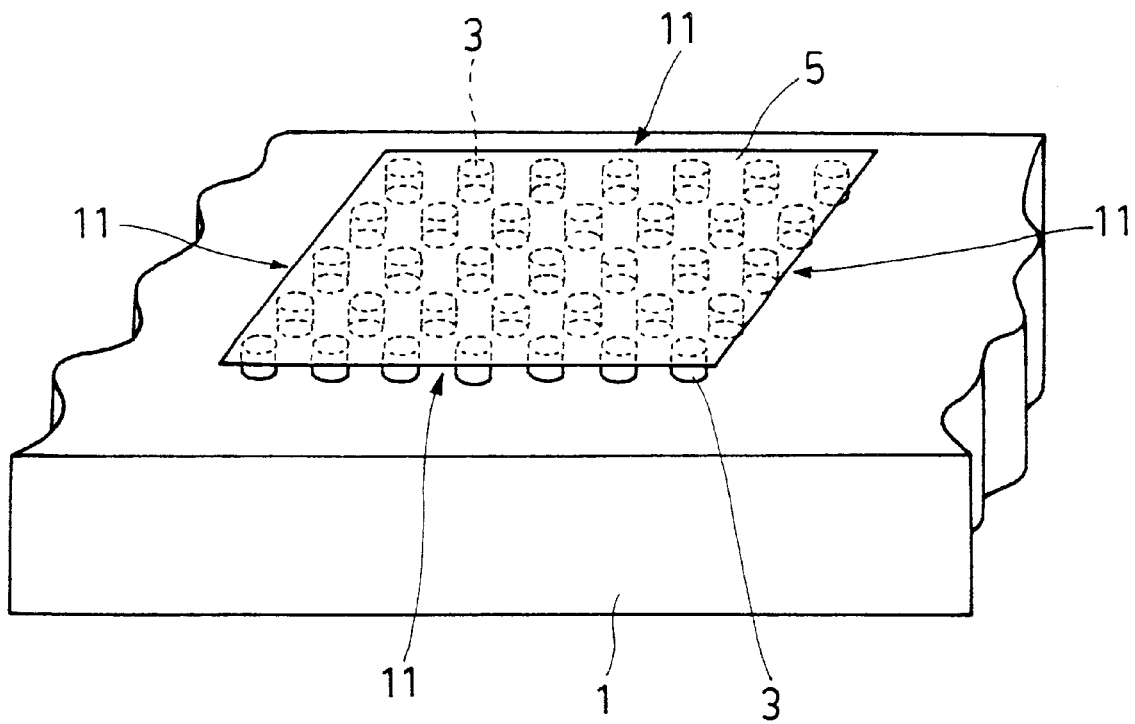
FIG. 25 is a schematic perspective view showing a thin-film substrate fabricated by a fourth embodiment of a method for fabricating a thin-film substrate according to the invention, and support members thereof.
Figure 26:
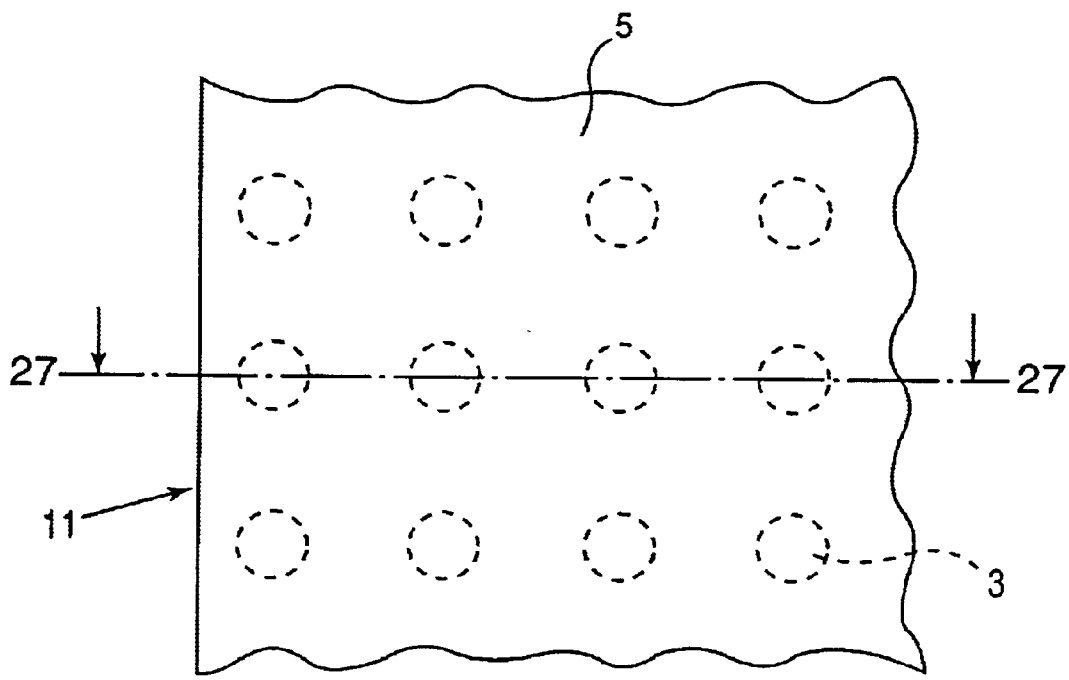
FIG. 26 is a plan view showing a portion of the thin-film substrate.
Figure 27:
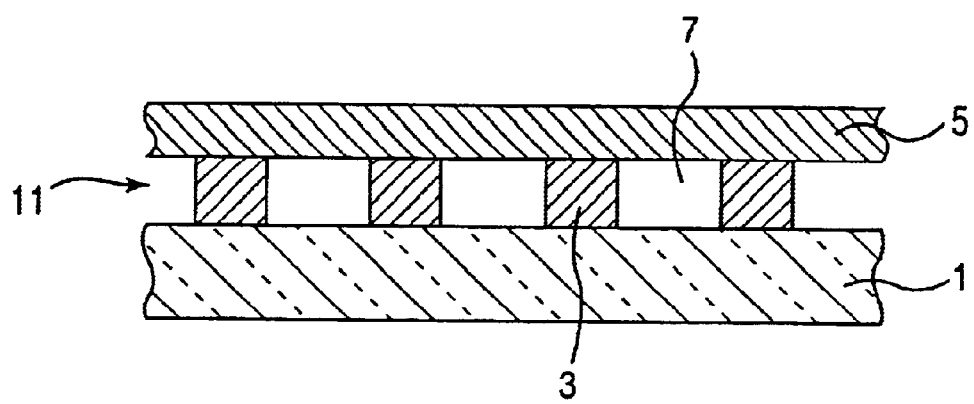
FIG. 27 is a cross-sectional view taken on line 27—27 of FIG. 26.

FIG. 25 is a schematic perspective view showing a thin-film substrate fabricated by the fourth embodiment of a method for fabricating a thin-film substrate according to the invention, and support members thereof. FIG. 26 is a plan view showing a portion of the thin-film substrate, and FIG. 27 is a cross-sectional view taken on line 27—27 of FIG. 26. In these figures, parts corresponding to those in FIGS. 1 to 3 are denoted by like reference numerals.

First, a support structure of the thin-film substrate fabricated by the fourth embodiment of the method for fabricating the thin-film substrate according to the invention is described with reference to FIGS. 25 to 27.

The thin-film substrate 5 is retained by a multitude of supports 3 formed and arrayed on a support base 1 which is a glass substrate, so as to be floatingly spaced away from the support base 1 by the height of a predetermined space provided between the thin-film substrate 5 and the support base 1, in the same way as shown in FIG. 1, and an opening 11 is provided between the four sides of the thin-film substrate 5 and the support base 1, respectively.

FIGS. 26 and 27 are enlarged views showing a portion of the thin-film substrate 5, including the openings 11. The supports 3 are cylindrical in shape, and are arrayed in a manner like a square matrix on the support base 1. As a typical value of the size of the respective supports 3, and that of a spacing therebetween, the diameter thereof and the spacing may be in a range of 1 $\mu$m or less to several hundred $\mu$m, and the height thereof may be in a range of 1 $\mu$m or less to several tens of $\mu$m.

Now, the fourth embodiment of the method for fabricating the thin-film substrate according to the invention will be described hereinafter. However, respective steps of the method, of forming the multitude of the supports 3 cylindrical in shape so as to be arrayed on the support base 1, forming the sacrifice layer 15 made of a resin material on the support base 1, and thereafter planarizing the sacrifice layer 15 so as to allow the top of the respective supports 3 to be exposed, up to the step of forming the thin-film substrate 5 on the entire upper surface of the sacrifice layer 15 and the supports 3, are the same as the respective steps of the first embodiment previously described with reference to FIGS. 4 to 9, therefore description thereof is omitted.

However, the fourth embodiment differs from the first embodiment only in that the supports 3 cylindrical in shape is 1.5 $\mu$m in height as compared with the first embodiment wherein the supports 3 are formed in the shape of the cylinder 8 $\mu$m in diameter, and 2.5 $\mu$m in height, and are arrayed in the manner like the square matrix at the pitch of 18 $\mu$m.

Figure 28:
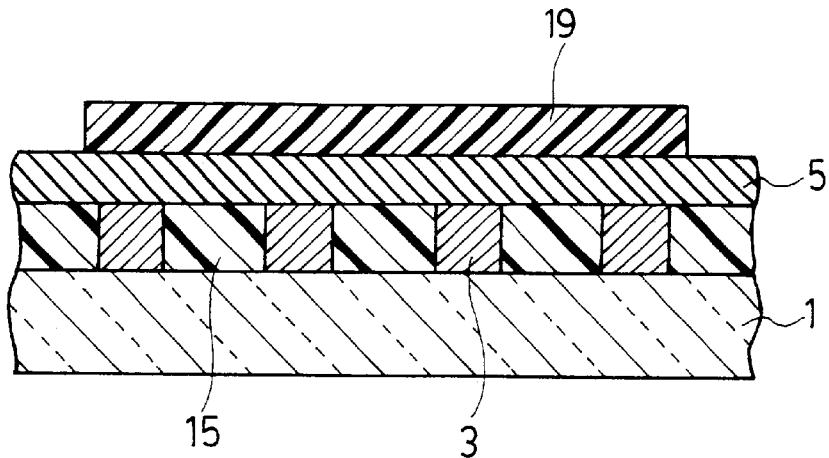
FIGS. 28 to 30 are cross-sectional views similar to FIG. 3, showing respective steps of the fourth embodiment of the method for fabricating the thin-film substrate according to the invention, differing from those for the first embodiment.

As shown in FIG. 28, a positive resist 19 is formed on the thin-film substrate 5 by ordinary photolithography treatment of a workpiece in the state shown in FIG. 9 so as to match a predetermined finished shape of the thin-film substrate 5.

Figure 29:
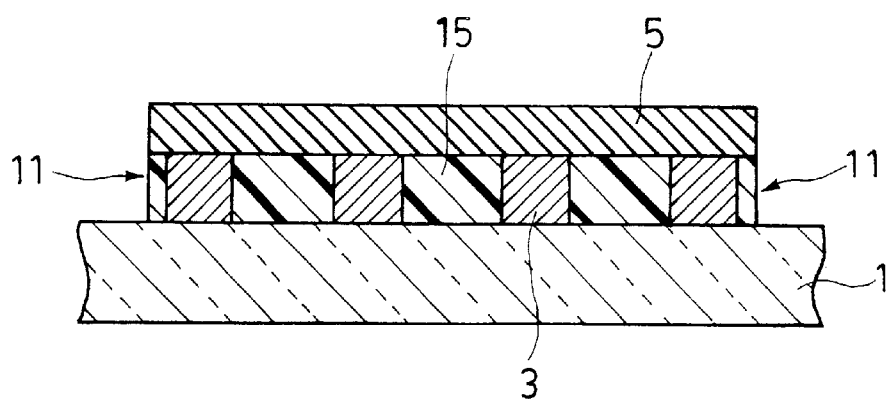

Subsequently, by dry etching using a gas containing sulfur hexafluoride ($SF_6$) as the main constituent thereof with the use of a parallel plate type 13.56 MHz RF excited etching system while using the resists 19 as a mask, the thin-film substrate 5 made of tantalum pentaoxide ($Ta_2O_5$) is etched, thereby shaping the thin-film substrate 5 into a predetermined shape as shown in FIG. 29.

Subsequently, by continuing the dry etching using the resist 19 as the mask, portions of the supports 3 and the sacrifice layer 15, in regions outside of the thin-film substrate 5 after shaped, are also etched and removed.

Etching conditions adopted at this time are as follows.

total pressure: 9.3 Pa (pascal)

gas introduced and a flow rate:
  $SF_6$, 300 sccm
  $O_2$, 23 sccm
  He, 8 sccm density of power turned on: 0.56 W/cm$^2$ Subsequently, the resists 19 is peeled off by dry ashing. Operating conditions adopted at this time are as follows.

total pressure: 27 Pa (pascal)

gas introduced and a flow rate:
  $O_2$, 100 sccm

Figure 30:
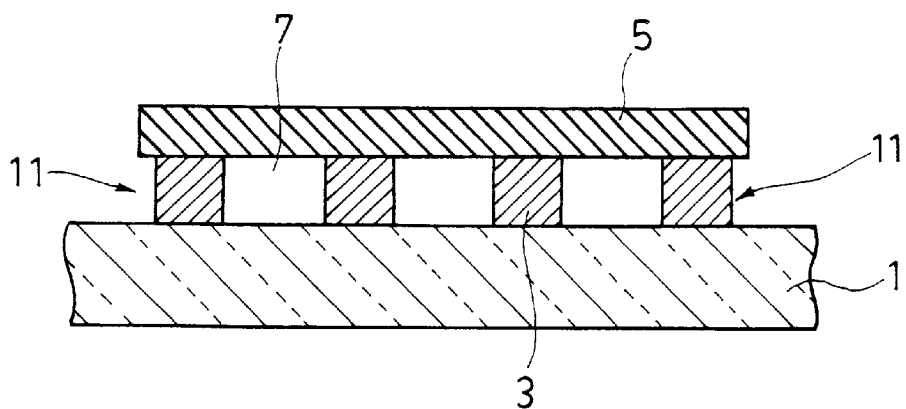

He, 50 sccm 0.22 W/cm² density of power turned on:

Next, plasma selective etching of the sacrifice layer 15 by oxygen plasma is carried out through the thin-film substrate 5, and as shown in FIG. 30, space 7 is provided between the thin-film substrate 5 and the support base 1, thereby forming the thin-film substrate 5 retained by the supports 3.

At this point in time, the plasma selective etching proceeds through the intermediary of the thin-film substrate 5 at the outset, the spaces 7 are formed in the upper part of the sacrifice layer 15, and the spaces 7 adjacent to each other are linked together, joining further with the opening 11. Thereupon, reaction products of the sacrifice layer 15 and active species generated by the selective etching comes to be efficiently discharged through the opening 11 as well. For an etching system to be employed at this time, a parallel plate type 13.56 MHz RF excited etching system is adopted. A typical example of operating conditions adopted at this time (conditions of the plasma selective etching) is shown as follows.

total pressure: 100 to 1500 Pa gas introduced and a flow rate: $O_2$, 100 sccm density of power turned on: 4.5 W/cm² substrate temperature: 100° C.

distance between parallel plate electrodes: 10 to 40 mm

By the method for fabrication as described above, the thin-film substrate 5 shown in FIG. 25 is completed.

Since this embodiment of the invention is also characterized by the plasma selective etching of the sacrifice layer 15 in the case of using an electrically conductive material for the supports 3, and the agency of the opening 11, the plasma selective etching is described in more details hereinafter with reference to FIGS. 31 to 38.

Figure 31:
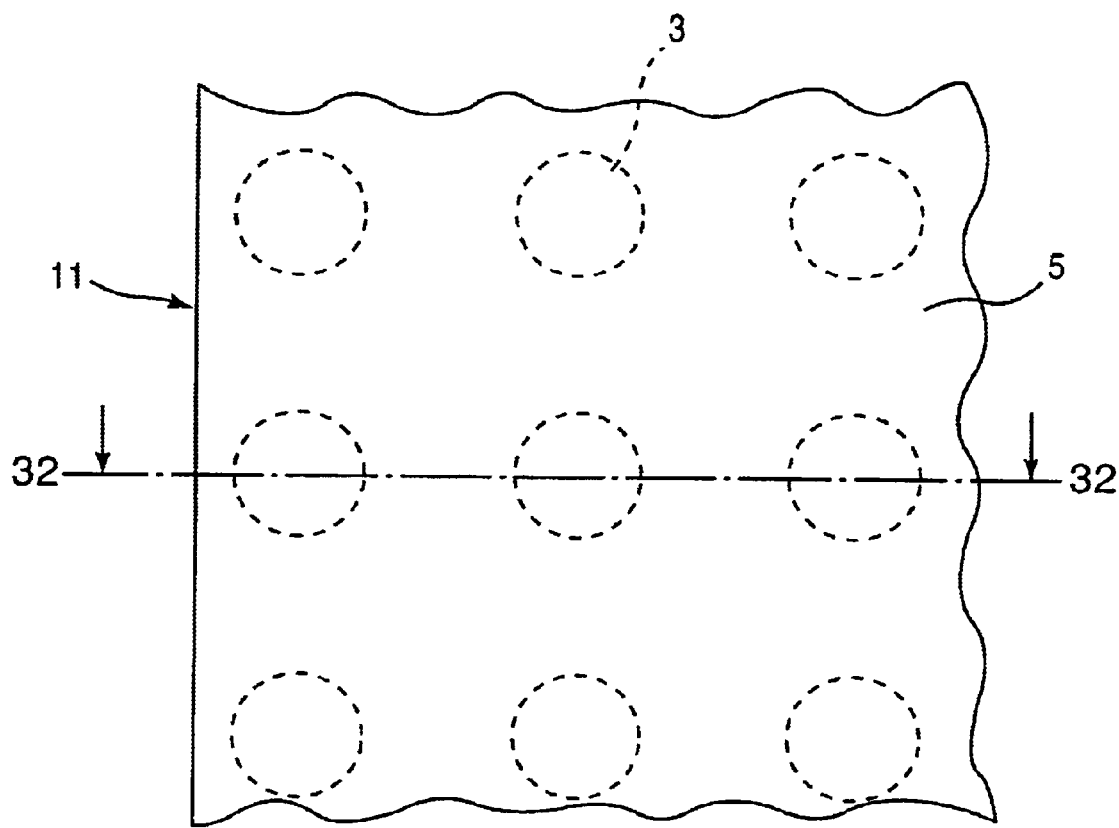
FIGS. 31 to 38 are plan views, and cross-sectional views of the respective plan views, for illustrating in detail plasma selective etching of a sacrifice layer, starting from a state of a workpiece, shown in FIG. 29.
Figure 32:
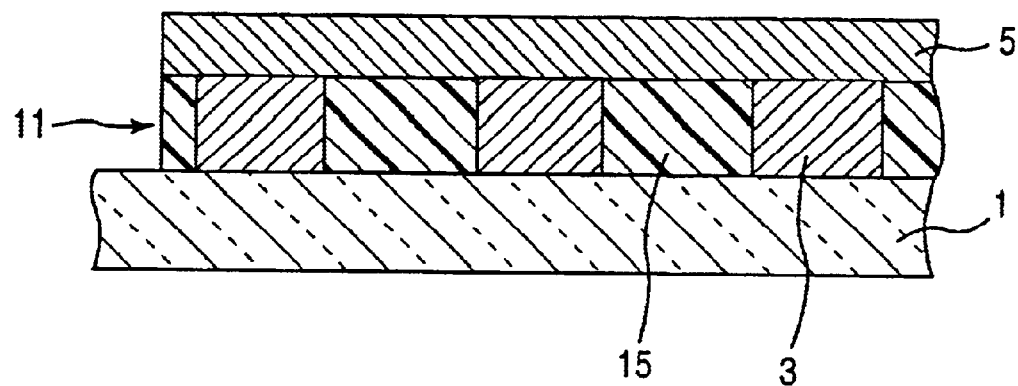

FIG. 31 is a plan view of a portion of the thin-film substrate 5, in the vicinity of the opening 11, showing a state thereof prior to removal of the sacrifice layer 15 in carrying out the method for fabricating the thin-film substrate according to the present embodiment described above, and FIG. 32 is a cross-sectional view taken on line 32—32 of FIG. 31.

The supports 3 cylindrical in shape are formed on the support base 1, and an interspace among the respective supports 3 is completely filled up with the sacrifice layer 15 as planarized. Further, the thin-film substrate 5 is formed on top of the sacrifice layer 15 and the supports 3. By etching a portion of the thin-film substrate 5, the opening 11 is provided.

Figure 33:
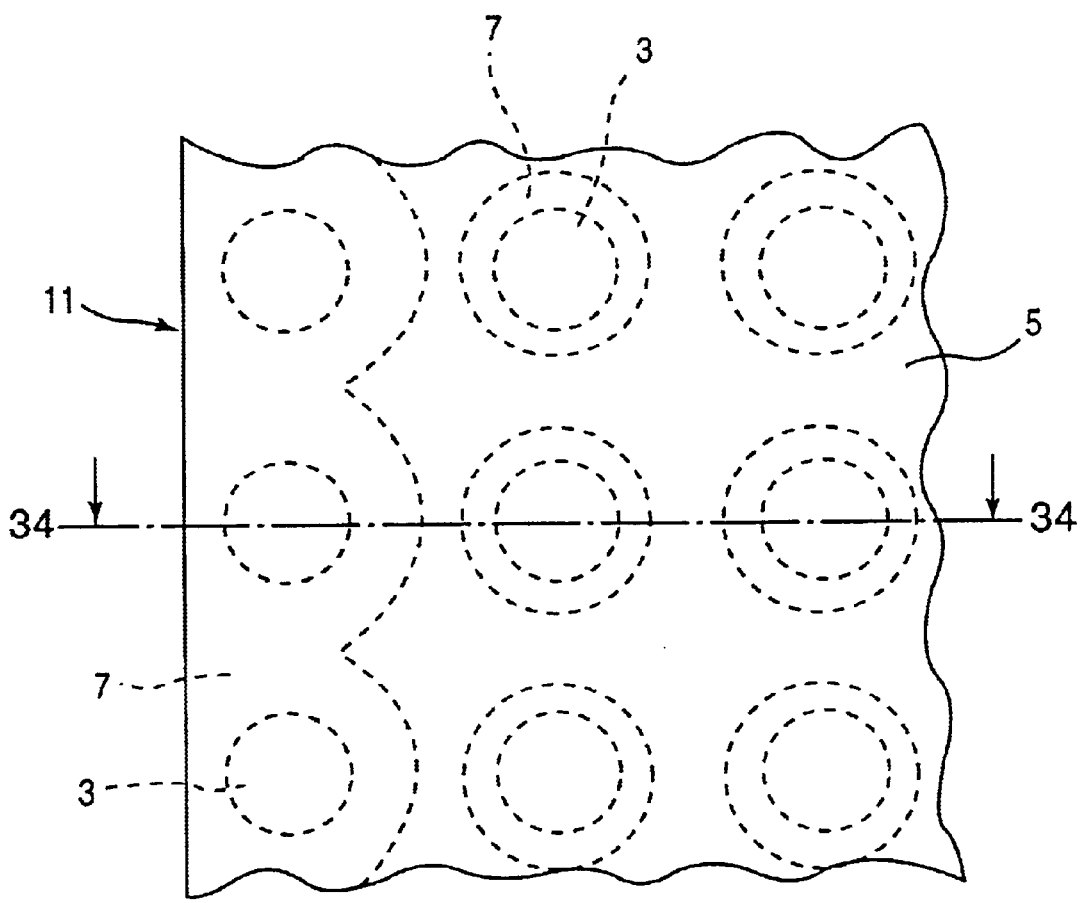

With a workpiece in such a state as described above, upon dry etching of the sacrifice layer 15 through the intermediary of the thin-film substrate 5 on condition of plasma selective etching using a gas containing oxygen as the main constituent thereof, etching of the sacrifice layer 15 starts from portions thereof around the respective supports 3 so as to form the spaces 7 each in a shape similar to the outer boundary of the respective supports 3, as shown in a plan view of FIG. 33.

Figure 34:
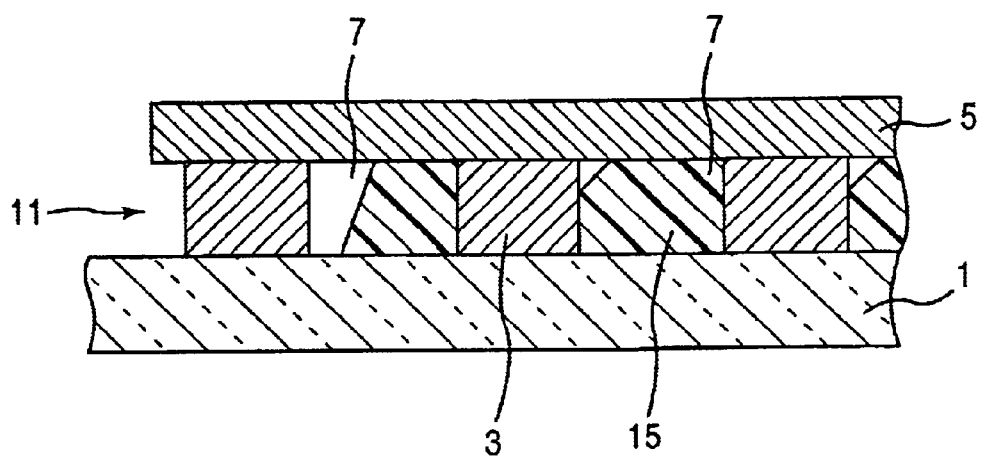

In a portion of the sacrifice layer 15, close to the opening 11, further etching in the transverse direction through the opening 11 proceeds simultaneously. At this point in time, the etching proceeds from the portion of the sacrifice layer 15, closer to the thin-film substrate 5, around the respective supports 3 having electrically conductive properties, thereby forming the spaces 7 as shown in FIG. 34. Further, because the active species flow in through the opening 11, the etching proceeds in the transverse direction as well, thereby forming spaces 7.

In the course of the etching at this stage, the etching of the sacrifice layer 15 proceeds only through the intermediary of the thin-film substrate 5 inside some of the spaces 7, other than those in the vicinity of the opening 11 as previously described.

Accordingly, there is evolved a gas due to reaction of the active species and the resin material of the sacrifice layer 15 inside some of the spaces 7, other than those in the vicinity of the opening 11, and the gas remains trapped in the respective spaces 7. Because of an increase in volume due to transformation of the resin material into the gas, a pressure inside the respective spaces 7 becomes higher as compared with that outside of the thin-film substrate 5. With such a pressure acting as a driving force, the gas produced by the reaction is discharged to the outside through the thin-film substrate 5, thus causing progress in the etching.

Figure 35:
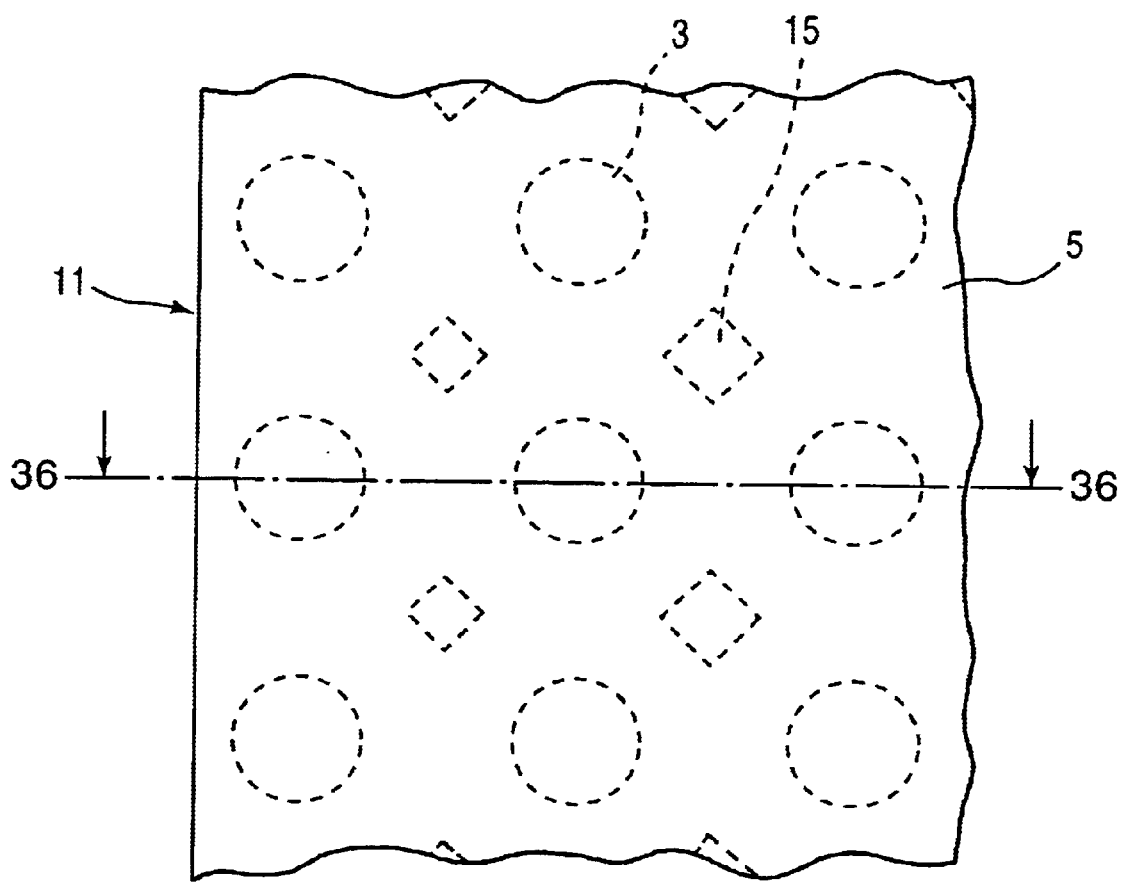
Figure 36:
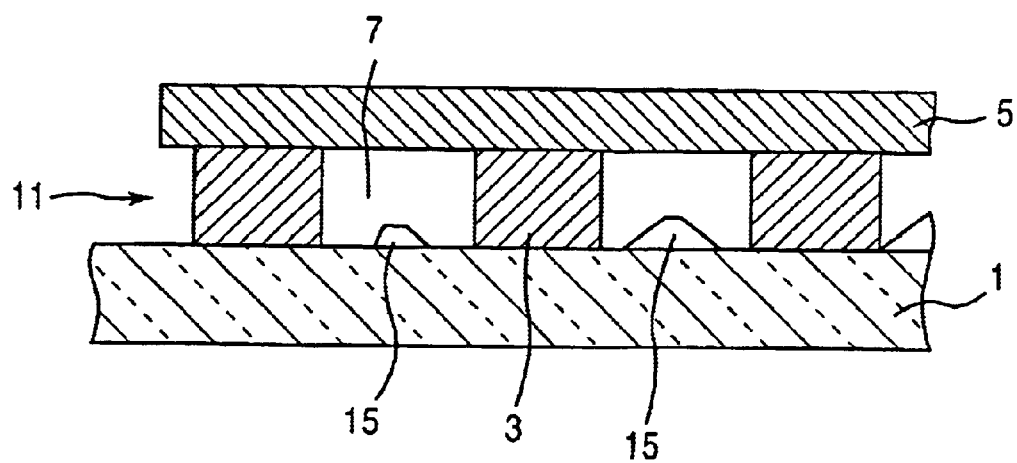

Upon further continuation of the etching, the respective spaces 7 are further expanded as shown in a plan view of FIG. 35 and in a cross-sectional view of FIG. 36. The selective etching proceeds at a high etching rate around the respective supports 3, however, if the supports 3 are sufficiently close to each other, an etching rate across the thin-film substrate 5 can also be increased.

As a result, the spaces 7 formed around the supports 3 adjacent to each other are linked with each other. Once the spaces 7 are linked with each other, the gas produced by the reaction which has evolved in the spaces 7 and is at a high pressure, is not only diffused to the outside through the thin-film substrate 5 but also starts flowing towards the opening 11 at a stroke with the pressure of the gas acting as a driving force. In this case, the opening 11 functions as a kind of discharge port such as a smoke stack for the gas produced by the reaction.

Figure 37:
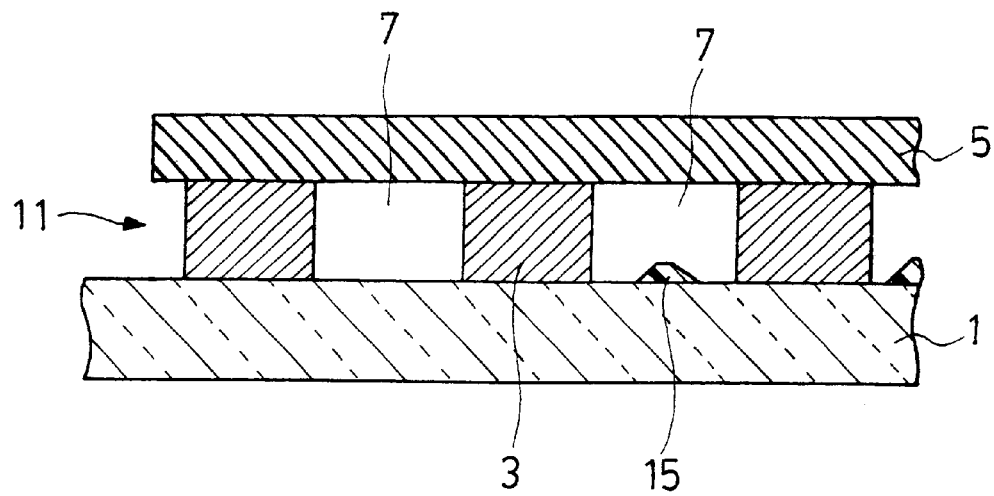
Figure 38:
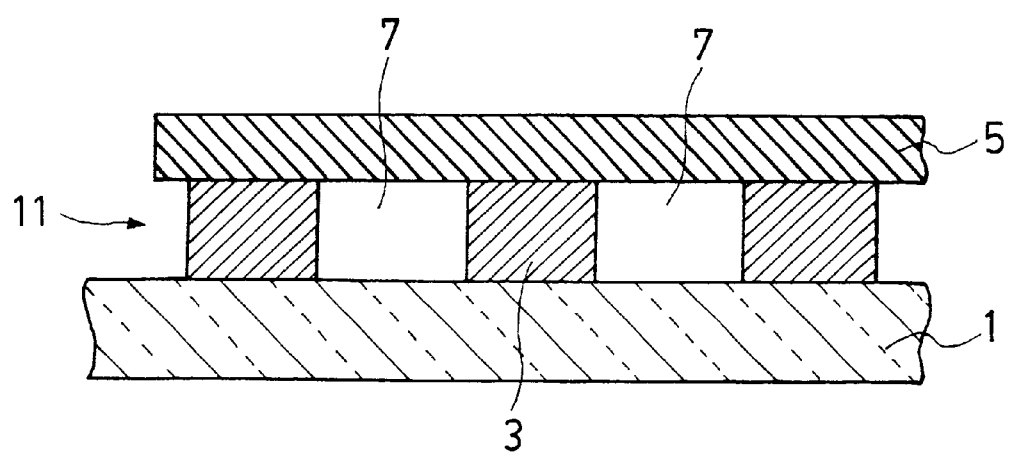

Upon still further continuation of the etching, the etching proceeds such that residue of the sacrifice layer 15 left out in the spaces 7 in the vicinity of the supports 3, on a side closer to the opening 11, is eliminated ahead of residue of the sacrifice layer 15 left out in the spaces 7, on a side further away from the opening 11, as shown in FIG. 37.

Further, the etching is continued on, whereupon the sacrifice layer 15 is fully removed, and thereby the thin-film substrate 5 spaced by the space 7 away from the support base 1 is fabricated.

Now, based on results of tests conducted by the inventors, explanation is given hereinafter on increased-rate etching effects of the selective etching of the sacrifice layer 15 through the intermediary of the thin-film substrate 5 in the case of using the electrically conductive material for the supports 3 in carrying out the method for fabricating the thin-film substrate.

Figure 39:
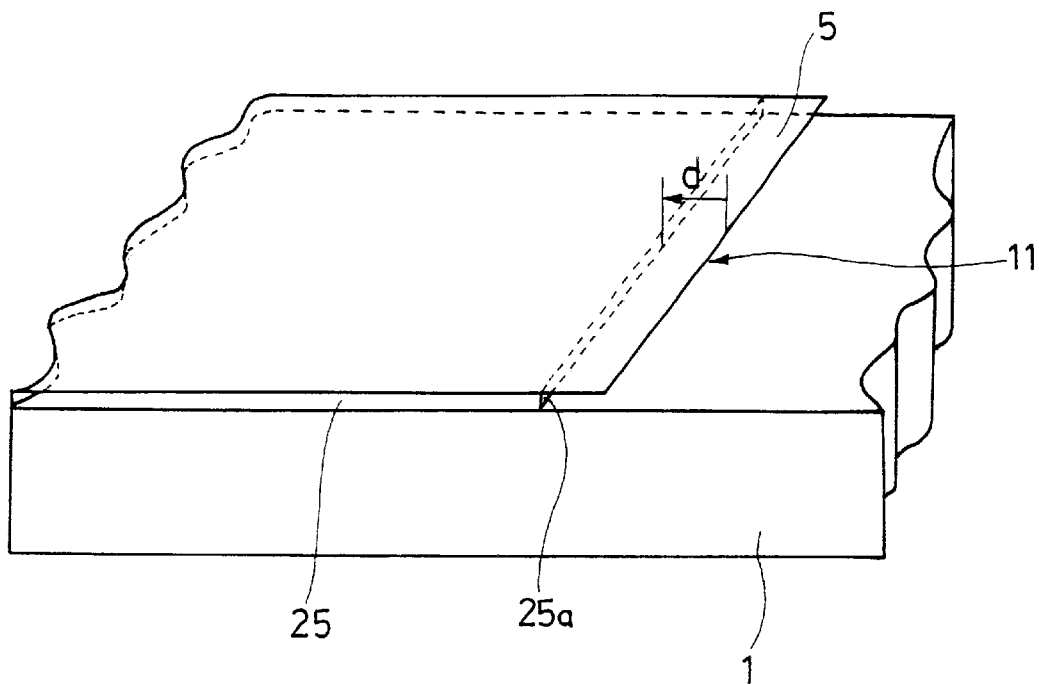
FIG. 39 is a schematic perspective view showing a support structure of a thin-film substrate fabricated for comparative purposes in order to find an etching amount in the transverse direction from an opening according to the fourth embodiment of the invention.

FIG. 39 is a schematic illustration of a thin-film substrate fabricated so as to allow etching of a sacrifice layer to proceed only through an opening for the sake of comparison. A whole-surface sacrifice layer 25 was formed to a thickness 1.5 μm on top of a support base 1, and a thin-film substrate 5 was formed on top of the whole-surface sacrifice layer 25 by sputtering.

The support base 1 was made up of a glass substrate, and for the whole-surface sacrifice layer 25, use was made of "V −259 PA" which is an acrylic negative resist, manufactured by Nippon Steel Chemical Co., Ltd. Processing steps up to the step of forming the whole-surface sacrifice layer 25 from the negative resist to a thickness slightly thicker than a target thickness before reducing the thickness to 1.5 μm by etching back were the same except that supports were not formed as those of the method for fabricating the thin-film substrate, as previously described in the fourth embodiment of the invention.

For the thin-film substrate 5, a Ta$_2$O$_5$ film formed to a thickness about 800 nm was used. An etching rate at which etching proceeds through the thin-film substrate 5 was held down by setting the thickness at about 800 nm. Further, an opening 11 was provided.

Following the formation of the thin-film substrate 5, the whole-surface sacrifice layer 25 was etched so as to be rendered into a shape similar to that of the thin-film substrate 5.

By controlling an etching time in this case, an etching distance d from an edge of the opening 11 of the thin-film substrate 5 to an etching front 25a of the whole-surface sacrifice layer 25 was kept at 1 µm or less.

Subsequently, dry etching by oxygen plasma in the same chamber was concurrently applied to the thin-film substrate prepared as above for comparative purposes, and the thin-film substrate, 200 nm in thickness, made of tantalum pentaoxide (Ta$_2$O$_5$), in the shape of a square with each side 3 mm (3 mm square), fabricated by the method for fabricating the thin-film substrate previously described in the fourth embodiment of the invention, wherein the supports 3 made of molybdenum (Mo) are formed in the shape of the cylinder 8 µm in diameter and 1.5 µm in height, and are arrayed in the manner like the square matrix at the pitch of 18 µm.

Operating conditions adopted at this time (conditions of the plasma selective etching) are as follows.

total pressure: 1330 Pa (pascal)

gas introduced and a flow rate: O$_2$, 100 sccm density of power turned on: 4.5 W/cm$^2$ substrate temperature: 100° C.

distance between parallel plate electrodes: 14 mm

With the thin-film substrate 5 for comparative purposes, the etching distance d from the edge of the opening 11 to the etching front 25a, shown in FIG. 39, was found at about 30 µm after the elapse of an etching time of 30 minutes. Meanwhile, with the thin-film substrate 5 in the shape of a 3 mm square, fabricated by the method for fabricating the thin-film substrate according to the invention, it was possible to completely remove the sacrifice layer 15.

This shows therefore that, in a mechanism of the selective etching in the case of the method for fabricating the thin-film substrate according to the invention, etching in the transverse direction is not dominant.

As is evident from the foregoing description, with the method for fabricating the thin-film substrate according to the invention, the selective etching of the sacrifice layer 15 is caused to occur mainly through exchange between the active species and the volatile reaction products through the thin-film substrate 5.

Particularly, in the case of using the electrically conductive material for the supports 3, the selective etching proceeds at a high rate starting from the vicinity of the outer boundary of the respective supports 3. Further, because the opening 11 functions as the discharge port of a gas produced by the reaction, capable of increasing a discharge rate of the gas, the selective etching can proceed at high rate.

Consequently, the thin-film substrate fabricated by the method for fabricating the thin-film substrate according to the invention does not particularly require a multitude of openings. Accordingly, it is possible to fabricate a large-area thin-film substrate structured so as to be floatingly spaced away from the support base.

Figure 40:
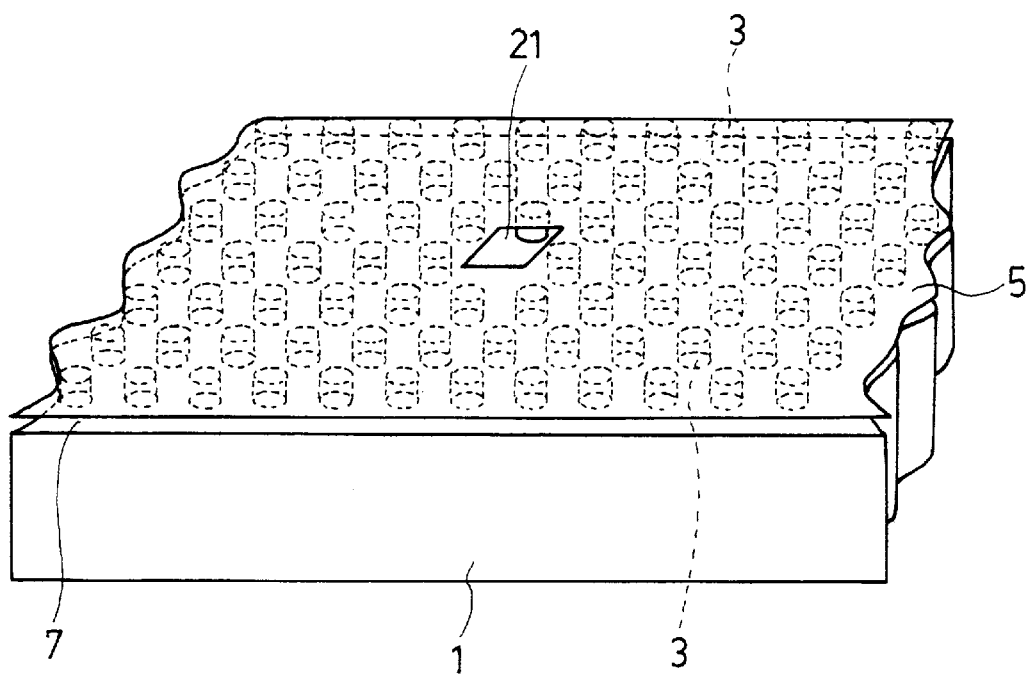
FIG. 40 is a schematic perspective view showing a thin-film substrate having an opening rectangular in shape, fabricated by a fifth embodiment of a method for fabricating a thin-film substrate according to the invention, and support members thereof.

Fifth Embodiment: FIG. 40

Next, a thin-film substrate fabricated by a fifth embodiment of a method for fabricating a thin-film substrate according to the invention is described with reference to FIG. 40. In FIG. 40, parts corresponding to those in FIG. 25 are denoted by like reference numerals.

With a thin-film substrate 5 shown in FIG. 40, supports 3 cylindrical in shape are formed on a support base 1, and a space 7 is provided between the thin-film substrate 5 and the support base 1 such that the thin-film substrate 5 is disposed so as to be retained by the supports 3.

Further, an opening 21 in a predetermined shape and size is defined on the thin-film substrate 5. In this embodiment, a case of the opening 21 being a square in shape is shown, however, the opening 21 may be in other shapes such as a rectangular shape, circular shape, strip-like shape, or so forth.

The method for fabricating the thin-film substrate according to this embodiment is the same as the method for fabricating the thin-film substrate according to the above described fourth embodiment of the invention except that the opening for the former differs in shape from that for the latter. Also, as for the role of the opening 21, it functions mainly as a discharge port of a gas produced by reaction during a processing step of selective etching of a sacrifice layer as with the opening 11 in the previously described embodiment.

Accordingly, since selective etching proceeds through the thin-film substrate 5 without relying on etching in the transverse direction through the opening 21, the openings 21 may be small in surface area and in the number may suffice.

For example, in the case of fabricating a thin-film substrate supported by supports 3 in the shape of a cylinder 8 µm in diameter, arrayed in a manner like a square matrix at a pitch of 18 µm, even if an opening 21 is defined in the shape of a square with each side in a range of 1 µm or less to several µm, and one piece of the opening is provided for every 100 µm×100 µm surface area of the thin-film substrate, this will be quite effective in improving an etching rate.

Figure 41:
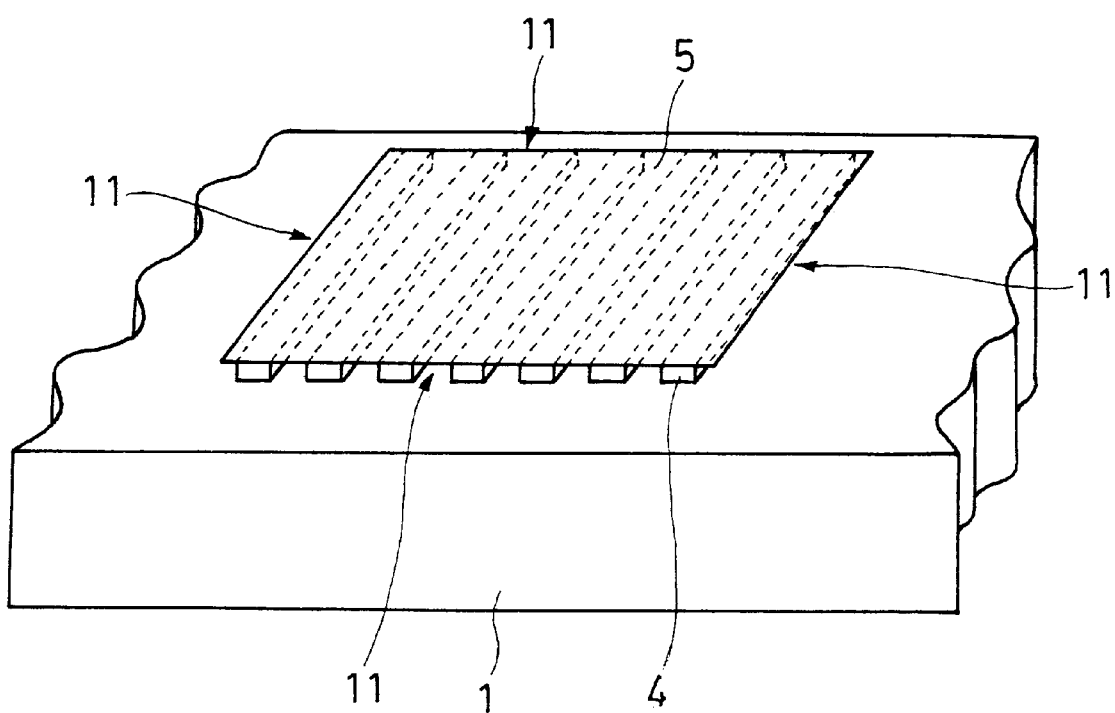
FIG. 41 is a schematic perspective view showing a thin-film substrate fabricated by a sixth embodiment of a method for fabricating a thin-film substrate according to the invention, and support members thereof.
Figure 42:
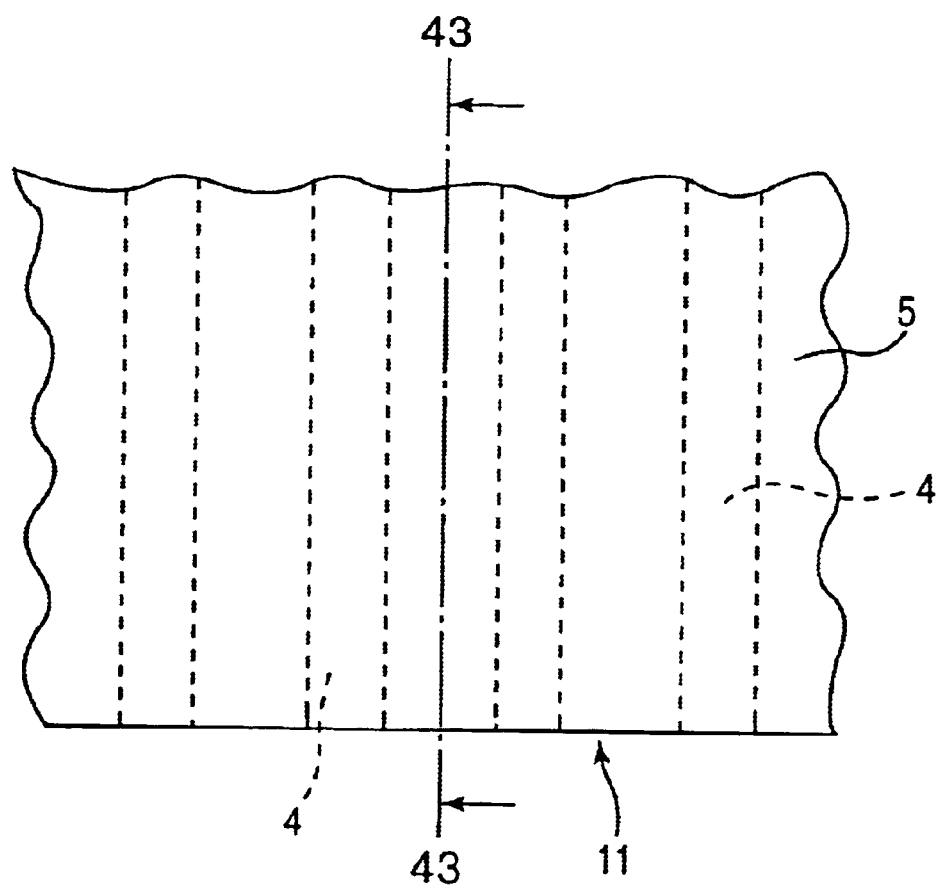
FIG. 42 is a plan view showing a portion of the thin-film substrate.
Figure 43:
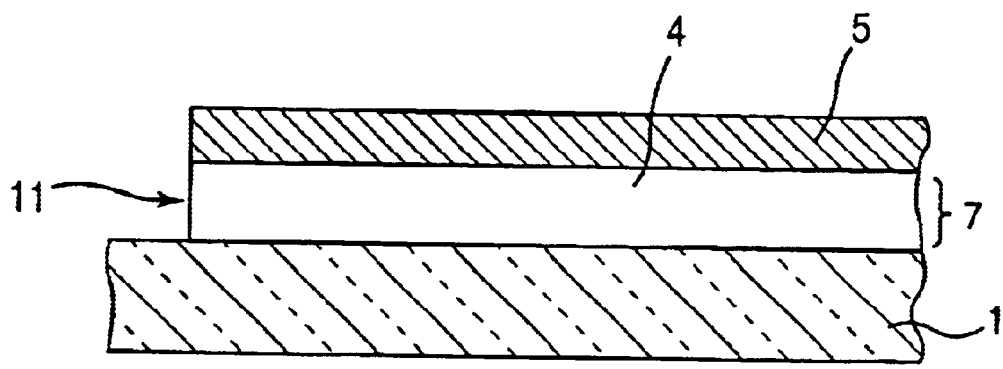
FIG. 43 is a cross-sectional view taken on line 43—43 of FIG. 42.
Figure 44:
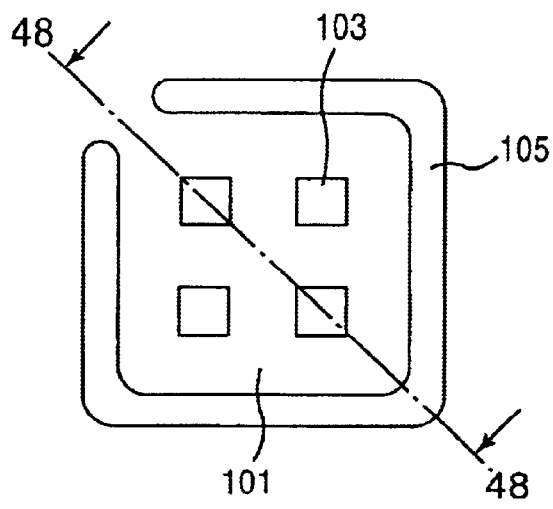
FIGS. 44 to 47 are plan views showing sequential steps of a conventional method for fabricating a structure used in the fabrication of a movable mirror of a spatial light modulator.
Figure 45:
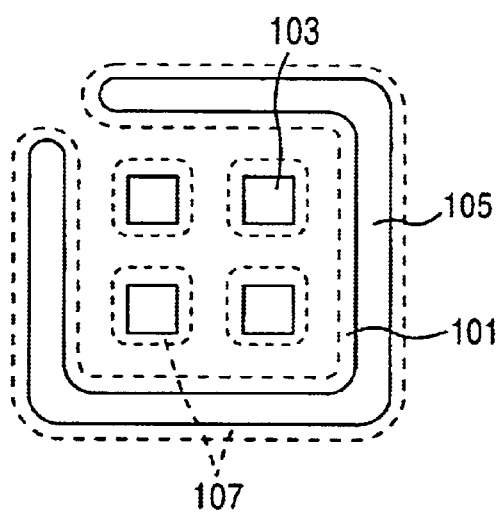
Figure 46:
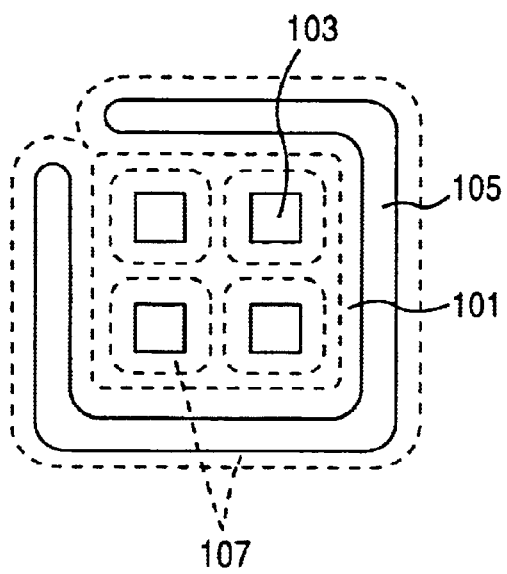
Figure 47:
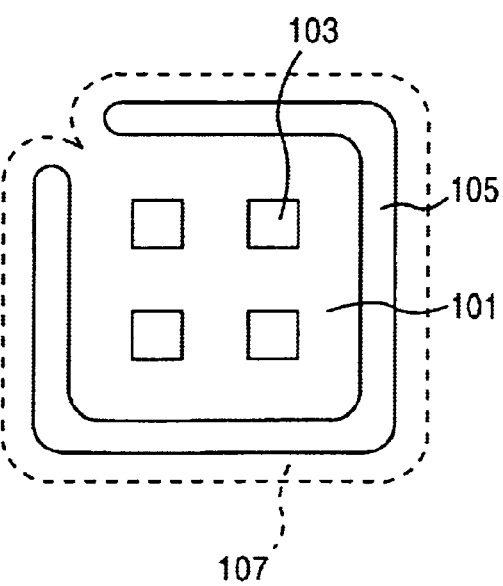
Figure 48:
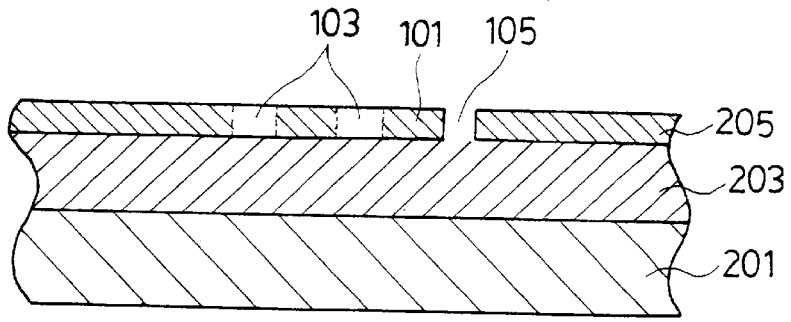
FIGS. 48 to 51 are cross-sectional views taken on line 48—48 of FIG. 44, showing the sequential steps of the conventional method for fabricating the structure.
Figure 49:
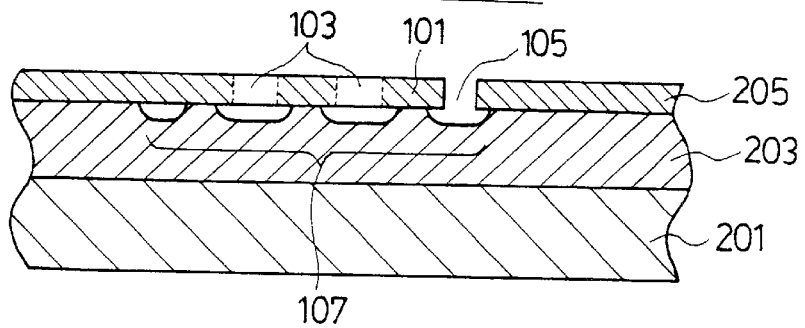
Figure 50:
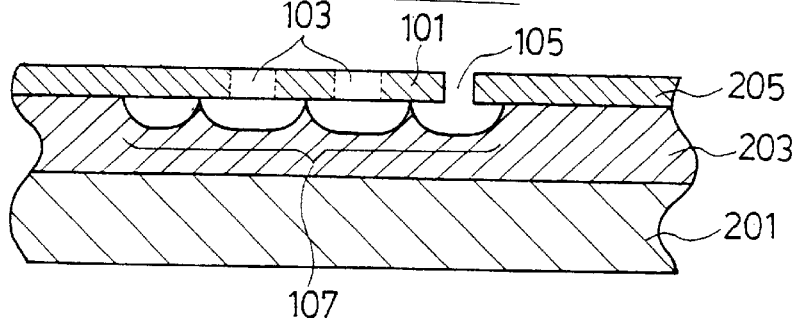
Figure 51:
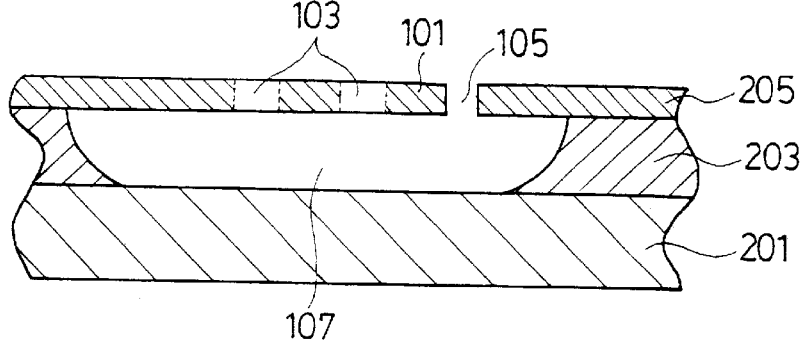

Sixth Embodiment: FIGS. 41 to 43

As described in the foregoing, with the fourth and fifth embodiments of the method for fabricating the thin-film substrate according to the invention, the supports for supporting the thin-film substrate are formed in the shape of a cylinder. However, with the method for fabricating the thin-film substrate according to the invention, the shape of the supports need not be cylindrical.

Referring to FIGS. 41 to 43, description is given hereinafter on a sixth embodiment of a method for fabricating a thin-film substrate according to the invention, wherein supports for supporting the thin-film substrate are formed in a shape of a cuboid wall.

FIG. 41 is a perspective view showing a thin-film substrate fabricated by the sixth embodiment of the method for fabricating the thin-film substrate according to the invention, and support members thereof. In the figure, parts corresponding to those in FIG. 25 are denoted by like reference numerals.

With a thin-film substrate 5, supports 4 formed in a shape of a cuboid wall are arrayed at given intervals on a support base 1, and the thin-film substrate 5 is formed on top of the supports 4. Further, an opening 11 is provided between the four sides of the thin-film substrate 5 and the support base 1.

FIG. 42 is an enlarged plan view showing a portion of the thin-film substrate, in the vicinity of the opening 11 shown in FIG. 41, and FIG. 43 is a cross-sectional view taken on line 43—43 of FIG. 42.

The thin-film substrate 5 is spaced and floated away from the support base 1 by a space 7, except portions thereof in contact with the supports 4. The method for fabricating the thin-film substrate according to this embodiment of the invention is the same as that for the fourth embodiment, except that the supports 4 are formed in the shape of the cuboid wall, therefore description thereof is omitted.

Other Examples of Variations

With the method for fabricating the thin-film substrate according to the invention, a quartz substrate or a silicon wafer, besides the previously described glass substrate, may be used for the support base. More specifically, a support base formed of a silicon (Si) based material or a silica ($SiO_2$) based material is preferably used for the support base.

Further, in order to improve adhesion of the support base with the supports made of metal, a support base formed of a silicon (Si) based material or a silicon dioxide ($SiO_2$) based material, such as the glass substrate, quartz substrate, silicon wafer, as previously described, with a thin-film of a metal oxide such as tantalum pentaoxide ($Ta_2O_5$) formed thereon may be used as the support base.

Further, with the method for fabricating the thin-film substrate according to the invention, photo resist may be used as material for forming the sacrifice layer. For example, positive photo resist, "TFR-H" (manufactured by TOKYO OHKA KOGYO CO., LTD.) may be used. With the use thereof, unnecessary portions of the sacrifice layer can be removed with ease by a photolithography treatment.

Also, in the case of using an electrically conductive material in forming the supports for supporting the thin-film substrate, a metallic material such as aluminum (Al), tungsten (W), tantalum (Ta), titanium (Ti), and so forth, besides molybdenum (Mo), a metallic material doped with a trace of nitrogen such as $TaN_x$, and so forth, or an electrically conductive semiconductor material such as ITO, $SnO_2$, or ZnO may be used as the electrically conductive material.

As material for use in the thin-film substrate, an insulating material mainly based on any selected from the group consisting of silicon oxide such as silicon monoxide (SiO) and silica ($SiO_2$), titanium dioxide ($TaO_2$), $Si_3N_4$, and so forth, besides tantalum oxides such as tantalum pentaoxide ($Ta_2O_5$), may be used.

As the gas used in the plasma selective etching for removal of the sacrifice layer, oxygen ($O_2$) with a trace of sulfur hexafluoride ($SF_6$) added thereto, $O_2$ with a trace of $CF_4$ added thereto, $N_2O$, or so forth may be used besides oxygen ($O_2$).

INDUSTRIAL APPLICABILITY

As is evident from the foregoing description, with the method for fabricating a thin-film substrate according to the invention, a thin-film substrate having a large area, spaced floatingly away from a support base, can be fabricated by a simple process, and the thin-film substrate fabricated is applicable to various uses.

It is highly expected that the thin-film substrate will be applicable to various uses such as a semiconductor device including, for example, a high-frequency LSI, a TFT using a thin-film silicon single crystal formed as a thin-film substrate, a high sensitivity temperature sensor, a heat sink, a multilayer printed circuit board, a MEMS, and so forth.

What is claimed is:

1. A method for fabricating a thin-film substrate, wherein the thin-film substrate is fabricated on top of supports arrayed on a support base so as to be spaced away from the support base, said method comprising steps of:

forming the supports of an electrically conductive material in a predetermined shape on the support base;

forming a sacrifice layer made of a resin material on the support base;

planarizing the sacrifice layer so as to expose top of the respective supports;

forming the thin-film substrate of an insulating material containing tantalum oxide or silicon oxide as main constituent thereof on top of the sacrifice layer as planarized; and removing the sacrifice layer by plasma selective etching based on a reactive gas containing oxygen or oxygen atoms with a total pressure in a range of 100 Pa to 1500 Pa through intermediary of the thin-film substrate.

2. The method for fabricating a thin-film substrate according to claim 1, further comprising a step of forming an opening functioning as a discharge port of a volatile gas evolved as a result of the plasma selective etching in the thin-film substrate formed on the sacrifice layer between the step of forming the thin-film substrate and the step of removing the sacrifice layer.

3. The method for fabricating a thin-film substrate according to claim 1, wherein the supports are formed in a shape of a pillar.

4. The method for fabricating a thin-film substrate according to claim 1, wherein the supports are formed in a shape of a wall.

5. The method for fabricating a thin-film substrate according to claim 1, wherein the supports are formed of an electrically conductive material containing molybdenum (Mo) as main constituent thereof.

6. The method for fabricating a thin-film substrate according to claim 1, wherein the thin-film substrate is formed of tantalum pentaoxide ($Ta_2O_5$).

7. The method for fabricating a thin-film substrate according to claim 1, wherein the step of forming the supports in the predetermined shape on the support base is a step of forming a metal film on the support base, and forming the supports in the predetermined shape by applying photolithography and etching treatment to the metal film.

8. The method for fabricating a thin-film substrate according to claim 1, wherein the sacrifice layer is formed of a material containing acrylic resin as main constituent thereof in the step of forming the sacrifice layer.

9. The method for fabricating a thin-film substrate according to claim 1, wherein the sacrifice layer is formed of a photoresist material in the step of forming the sacrifice layer.

10. A method for fabricating a thin-film substrate, wherein the thin-film substrate is fabricated on top of supports arrayed on a support base so as to be spaced away from the support base, said method comprising steps of:

forming a metal film on the support base by sputtering method;

forming the supports in a predetermined shape by applying photolithography and etching treatment to the metal film;

forming a sacrifice layer by applying a resin material containing acrylic resin as main constituent thereof onto the support base by means of spin coater method;

planarizing the sacrifice layer by etching back the same through a plasma treatment thereof so as to expose top of the respective supports;

forming the thin-film substrate made of an insulating material containing tantalum oxide or silicon oxide as main constituent thereof on top of the sacrifice layer as planarized; and removing the sacrifice layer by plasma selective etching based on a reactive gas containing oxygen or oxygen atoms with a total pressure in a range of 100 Pa to 1500 Pa through intermediary of the thin-film substrate.

11. The method for fabricating a thin-film substrate according to claim 10, further comprising a step of forming an opening functioning as a discharge port of a volatile gas evolved as a result of the plasma selective etching in the thin-film substrate formed on the sacrifice layer between the step of forming the thin-film substrate and the step of removing the sacrifice layer.

12. The method for fabricating a thin-film substrate according to claim 10, wherein a support base formed of material containing silica ($SiO_2$) as main constituent thereof is used for the support base.

13. The method for fabricating a thin-film substrate according to claim 10, wherein a support base formed of material containing silicon (Si) as main constituent thereof is used for the support base.

14. The method for fabricating a thin-film substrate according to claim 10, wherein a support base formed of material containing silica ($SiO_2$) as main constituent thereof with a metal oxide thin-film formed thereon is used for the support base.

15. The method for fabricating a thin-film substrate according to claim 10, wherein a support base formed of a material containing silicon (Si) as main constituent thereof with a metal oxide thin-film formed thereon is used for the support base.

16. The method for fabricating a thin-film substrate according to claim 10, wherein the supports are formed in a shape of a pillar.

17. The method for fabricating a thin-film substrate according to claim 10, wherein the supports are formed in a shape of a wall.

18. The method for fabricating a thin-film substrate according to claim 10, wherein the metal film is formed of a material containing molybdenum (Mo) as main constituent thereof in the step of forming the metal film on the support base.

19. A method for fabricating a thin-film substrate, wherein the thin-film substrate is fabricated on top of supports arrayed on a support base so as to be spaced away from the support base, said method comprising steps of:

forming the supports of an electrically conductive material in a predetermined shape on the support base;

forming a sacrifice layer made of a resin material on the support base;

planarizing the sacrifice layer so as to expose top of the respective supports;

forming a porous film on the sacrifice layer as planarized by depositing silicon dioxide by oblique angle vapor deposition treatment;

removing the sacrifice layer by plasma selective etching based on a reactive gas containing oxygen or oxygen atoms with a total pressure in a range of 100 Pa to 1500 Pa through intermediary of the porous film; and subsequently forming the thin-film substrate of an insulating material on top of the porous film.

* * * * *

UNITED STATES PATENT AND TRADEMARK OFFICE
CERTIFICATE OF CORRECTION

PATENT NO. : 6,713,235 B1
DATED : March 30, 2004
INVENTOR(S) : Ide et al.

It is certified that error appears in the above-identified patent and that said Letters Patent is hereby corrected as shown below:

Column 9,
Line 12, change "200 ☐m" to -- 200nm --

Column 19,
Lines 14, 18 and 22, change "material" to -- a material --

Signed and Sealed this

Twenty-fourth Day of August, 2004

JON W. DUDAS
*Director of the United States Patent and Trademark Office*